(12) United States Patent
Miyake et al.

(10) Patent No.: US 10,345,661 B2
(45) Date of Patent: Jul. 9, 2019

(54) DISPLAY DEVICE, DISPLAY MODULE, AND ELECTRONIC DEVICE

(71) Applicant: SEMICONDUCTOR ENERGY LABORATORY CO., LTD., Atsugi-shi, Kanagawa-ken (JP)

(72) Inventors: Hiroyuki Miyake, Kanagawa (JP); Koji Kusunoki, Kanagawa (JP); Tetsuji Ishitani, Kanagawa (JP); Ryo Hatsumi, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/684,661

(22) Filed: Apr. 13, 2015

(65) Prior Publication Data

US 2015/0301422 A1 Oct. 22, 2015

(30) Foreign Application Priority Data

Apr. 22, 2014 (JP) ................... 2014-088200
Apr. 22, 2014 (JP) ................... 2014-088223
May 22, 2014 (JP) ................... 2014-106476

(51) Int. Cl.
*G02F 1/1362* (2006.01)
*G02F 1/1343* (2006.01)
(Continued)

(52) U.S. Cl.
CPC ...... *G02F 1/136213* (2013.01); *G02F 1/1368* (2013.01); *G02F 1/13338* (2013.01);
(Continued)

(58) Field of Classification Search
CPC ............................. G06F 3/0412; G06F 3/044
See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

CN    001510479 A    7/2004
CN    001749819 A    3/2006
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Dong Hui Liang
(74) *Attorney, Agent, or Firm* — Nixon Peabody LLP; Jeffrey L. Costellia

(57) ABSTRACT

To provide a display device with a novel structure that can achieve both thickness reduction and favorable display quality. In a structure of a display device including a liquid crystal layer between a pixel electrode and a counter electrode, a common electrode and an electrode of a capacitor in a touch sensor on the counter electrode side are formed integrally and supplied with a pulse signal. On the element substrate side, a signal to be supplied to a capacitor line that forms a capacitance with the pixel electrode is in conjunction with the pulse signal so as to cancel a change in an electric field applied to the liquid crystal layer. Such a structure can achieve a display device with a touch sensor function that can cancel a change in an electric field applied to a liquid crystal layer even when the electric field is changed by a pulse signal.

12 Claims, 21 Drawing Sheets

(51) Int. Cl.

| | | |
|---|---|---|
| *G02F 1/1368* | (2006.01) | |
| *H01L 27/12* | (2006.01) | |
| *H01L 29/786* | (2006.01) | |
| *G02F 1/1333* | (2006.01) | |
| *G06F 3/041* | (2006.01) | |
| *G06F 3/044* | (2006.01) | |
| *G09G 3/36* | (2006.01) | |

(52) U.S. Cl.
CPC ............. *G06F 3/041* (2013.01); *G06F 3/044* (2013.01); *G06F 3/0412* (2013.01); *G09G 3/3655* (2013.01); *H01L 27/124* (2013.01); *H01L 27/1225* (2013.01); *H01L 27/1255* (2013.01); *G09G 2300/0809* (2013.01)

(56) References Cited

U.S. PATENT DOCUMENTS

| | | | |
|---|---|---|---|
| 6,057,572 A * | 5/2000 | Ito | H01L 27/0629 257/296 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,557,869 B2 | 7/2009 | Bang et al. | |
| 7,674,650 B2 | 3/2010 | Akimoto et al. | |
| 7,732,819 B2 | 6/2010 | Akimoto et al. | |
| 7,742,041 B2 | 6/2010 | Lee et al. | |
| 7,839,392 B2 | 11/2010 | Pak et al. | |
| 8,243,027 B2 | 8/2012 | Hotelling et al. | |
| 8,259,078 B2 | 9/2012 | Hotelling et al. | |
| 8,395,575 B2 | 3/2013 | Lee et al. | |
| 8,432,371 B2 | 4/2013 | Hotelling et al. | |
| 8,451,244 B2 | 5/2013 | Hotelling et al. | |
| 8,552,989 B2 | 10/2013 | Hotelling et al. | |
| 8,654,083 B2 | 2/2014 | Hotelling et al. | |
| 9,184,408 B2 | 11/2015 | Saito et al. | |
| 9,244,561 B2 | 1/2016 | Hotelling et al. | |
| 9,268,429 B2 | 2/2016 | Hotelling et al. | |
| 9,390,667 B2 | 7/2016 | Ikeda et al. | |
| 9,449,996 B2 | 9/2016 | Yamazaki et al. | |
| 9,575,610 B2 | 2/2017 | Hotelling et al. | |
| 9,941,309 B2 | 4/2018 | Yamazaki et al. | |
| 10,191,576 B2 | 1/2019 | Hotelling et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0078856 A1 * | 4/2005 | Miyasaka | G06K 9/0002 382/124 |
| 2005/0199959 A1 | 9/2005 | Chiang et al. | |
| 2006/0017710 A1 * | 1/2006 | Lee | G02F 1/13338 345/173 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0167526 A1 | 7/2008 | Crank et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0161051 A1 * | 6/2009 | Fukunaga | G06F 3/0421 349/115 |
| 2009/0273580 A1 * | 11/2009 | Ota | G06F 3/0412 345/175 |
| 2009/0278122 A1 | 11/2009 | Hosono et al. | |
| 2009/0280600 A1 | 11/2009 | Hosono et al. | |
| 2009/0284270 A1 * | 11/2009 | Ota | G06F 3/0421 324/661 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0328239 A1 * | 12/2010 | Harada | G06F 3/0412 345/173 |
| 2011/0193816 A1 | 8/2011 | Kitakado | |
| 2012/0038585 A1 | 2/2012 | Kim | |
| 2013/0037798 A1 * | 2/2013 | Wong | H01L 29/7869 257/43 |
| 2015/0255518 A1 | 9/2015 | Watanabe et al. | |

(56) References Cited

U.S. PATENT DOCUMENTS

| | | | |
|---|---|---|---|
| 2015/0261333 | A1 | 9/2015 | Kaneyasu et al. |
| 2015/0301382 | A1 | 10/2015 | Ishitani et al. |

FOREIGN PATENT DOCUMENTS

| | | | |
|---|---|---|---|
| EP | 1737044 | A | 12/2006 |
| EP | 2226847 | A | 9/2010 |
| EP | 2259172 | A | 12/2010 |
| EP | 2330A92 | A | 6/2011 |
| EP | 2330491 | A | 6/2011 |
| EP | 2330493 | A | 6/2011 |
| EP | 2330494 | A | 6/2011 |
| EP | EP-2654082 | A | 10/2013 |
| EP | 3264240 | A | 1/2018 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | A | 5/1999 |
| JP | 2000-044236 | A | 2/2000 |
| JP | 2002-076356 | A | 3/2000 |
| JP | 2000-150900 | A | 5/2000 |
| JP | 2002-289859 | A | 10/2002 |
| JP | 2003-086000 | A | 3/2003 |
| JP | 2003-086808 | A | 3/2003 |
| JP | 2003-196023 | A | 7/2003 |
| JP | 2004-103957 | A | 4/2004 |
| JP | 2004-273614 | A | 9/2004 |
| JP | 2004-273732 | A | 9/2004 |
| JP | 2007-048275 | A | 2/2007 |
| JP | 2009-540374 | A | 11/2009 |
| JP | 2012-022311 | A | 2/2012 |
| JP | 2013-224977 | A | 10/2013 |
| JP | 2014-063141 | A | 4/2014 |
| WO | WO-2004/114391 | | 12/2004 |
| WO | WO-2007/146779 | | 12/2007 |
| WO | WO-2007/146780 | | 12/2007 |
| WO | WO-2007/146783 | | 12/2007 |
| WO | WO-2007/146785 | | 12/2007 |
| WO | WO-2014/021356 | | 2/2014 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wideband gap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al.. "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280

Ikeda.T et al., "Full-Functional System Liquid Crystal Display Using Cg-Siligon Technology", SID Digest '04 : SID International Symposium Digest of Technical Papers, 2004, vol. 35, pp 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL, YbFe2O4, and Yb2Fe3O7 Types of Structures for Compounds in the In2O3 and Sc2O3—A2O3—BO Systems [A; Fe, Ga, or Al; B: Mg, Mn, Fe, Nl, Cu,or Zn] at Temperatures Over 1000° C", Journal of Solid State Chemistry, 1985, vol. 60, pp. 382-384.

(56) References Cited

OTHER PUBLICATIONS

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7. 8. 9, and 16) in the $In_2O_3$—$ZnGa_2O_4$—$ZnO$ System", Journal of Solid State Chemistry, Apr. 1, 1995, vol. 116, No, 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—$ZnO$ system at 1350° C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline $O(ZnO)5$ films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature. Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White TANDEM OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)m$ (m<4):a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp, 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner 200a 209a 233 235 237 248

200a 233 235 249 237 248
209a

DISPLAY DEVICE, DISPLAY MODULE, AND ELECTRONIC DEVICE

BACKGROUND OF THE INVENTION

1. Field of the Invention

One embodiment of the present invention relates to a display device, a display module, and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

Display devices with a touch sensor function are widely used (see Patent Document 1).

REFERENCE

Patent Document

[Patent Document 1] Japanese Published Patent Application No. 2003-196023

SUMMARY OF THE INVENTION

In a display device with a touch sensor function, the touch sensor function increases the thickness of the display device. When the housing is thinned, a potential supplied to a display element is changed by a signal supplied to an electrode, which decreases display quality.

An object of one embodiment of the present invention is to provide a novel display device or the like.

Another object of one embodiment of the present invention to provide a display device or the like having a novel structure with which thickness reduction can be achieved. Another object of one embodiment of the present invention is to provide a display device or the like having a novel structure with which a change in a potential applied to a display element can be canceled.

Note that the objects of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to solve at least one of the aforementioned objects and the other objects.

One embodiment of the present invention is a display device including a first substrate, a second substrate, and a liquid crystal layer, further including a first transistor, a first capacitor, a first wiring, a first electrode, a second transistor, a second electrode, a second capacitor, and a third electrode. The liquid crystal layer is provided between the first electrode and the third electrode. The first transistor, the first capacitor, the first wiring, and the first electrode are provided for the first substrate. The first transistor is electrically connected to the first electrode. The first electrode has a function as a pixel electrode of the liquid crystal layer. One electrode of the first capacitor is electrically connected to the first electrode. The other electrode of the first capacitor is electrically connected to the first wiring. The first wiring has a function of being supplied with a first signal. The second transistor, the second electrode, the second capacitor, and the third electrode are provided for the second substrate. One of a source and a drain of the second transistor is electrically connected to the second electrode. The second electrode has a function as one electrode of the second capacitor. The third electrode has a function as the other electrode of the second capacitor. The third electrode has a function as a counter electrode of the liquid crystal layer. The third electrode has a function of being supplied with a second signal. The second signal is a signal that is changed at the same intervals as the first signal.

In the display device of one embodiment of the present invention, it is preferable that the second substrate include a third transistor and a fourth transistor, a gate of the third transistor be electrically connected to the second electrode, the other of the source and the drain of the second transistor be electrically connected to a second wiring, the second wiring have a function of being supplied with a constant potential, one of a source and a drain of the third transistor be electrically connected to one of a source and a drain of the fourth transistor, the other of the source and the drain of the fourth transistor be electrically connected to a third wiring, and the third wiring have a function of changing a potential thereof depending on a potential of the second electrode.

In the display device of one embodiment of the present invention, it is preferable that a semiconductor layer in the second transistor include an oxide semiconductor and a semiconductor layer in the third transistor include an oxide semiconductor.

In the display device of one embodiment of the present invention, it is preferable that the second electrode be an electrode provided in the same layer as the semiconductor layer in the second transistor and the semiconductor layer in the third transistor.

In the display device of one embodiment of the present invention, it is preferable that the first transistor include a first semiconductor layer, the first semiconductor layer include an oxide semiconductor, the first semiconductor layer include a first metal element, the first electrode include the first metal element and oxygen, the first semiconductor layer include a region with a first hydrogen concentration, the first electrode include a region with a second hydrogen concentration, and the first hydrogen concentration and the second hydrogen concentration be different from each other.

Note that other embodiments of the present invention will be described in the following embodiments and the drawings.

One embodiment of the present invention can provide a display device or the like having a novel structure.

One embodiment of the present invention can provide a display device or the like having a novel structure with which thickness reduction can be achieved. One embodiment of the present invention can provide a display device or the like having a novel structure with which a change in a potential applied to a display element can be canceled. Therefore, a display device having high display quality can be obtained.

DETAILED DESCRIPTION OF THE INVENTION

Figure 1A:
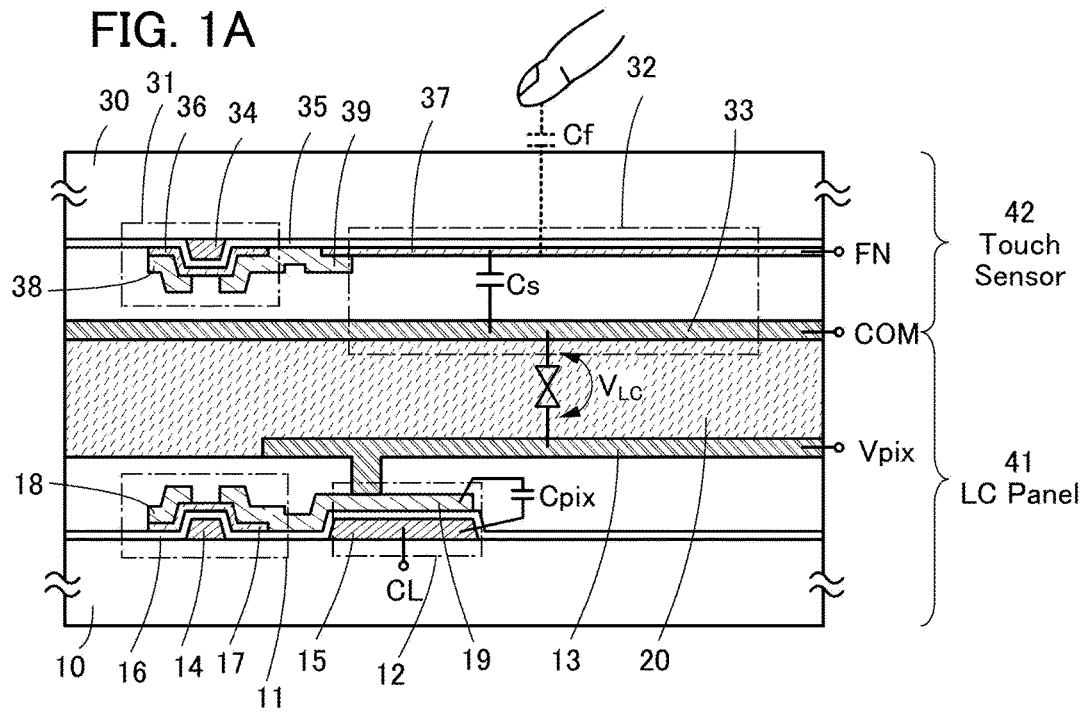
FIGS. 1A and 1B are a cross-sectional schematic view and a waveform diagram for illustrating one embodiment of the present invention.

Hereinafter, embodiments will be described with reference to the drawings. Note that the embodiments can be implemented in various different ways and it will be readily appreciated by those skilled in the art that modes and details of the embodiments can be changed in various ways without departing from the spirit and scope of the present invention. The present invention therefore should not be construed as being limited to the following description of the embodiments.

In the drawings, the size, the layer thickness, or the region is exaggerated for clarity in some cases. Therefore, embodiments of the invention are not limited to such scales. Note that the drawings are schematic views showing ideal examples, and embodiments of the present invention are not limited to the shapes or the values in the drawings. For example, variation in signal, voltage, or current due to noise or difference in timing can be included.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a portion that functions as a source or a portion that functions as a drain is not referred to as a source or a drain in some cases. In that case, one of the source and the drain might be referred to as a first electrode, and the other of the source and the drain might be referred to as a second electrode.

In this specification, ordinal numbers such as "first", "second", and "third" are used to avoid confusion among components, and thus do not limit the number of the components.

Note that in this specification, the expression "A and B are connected" or "A is connected to B" means the case where A and B are electrically connected to each other as well as the case where A and B are directly connected to each other. Here, the expression "A and B are electrically connected" means the case where electric signals can be transmitted and received between A and B when an object having any electric action exists between A and B.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that one embodiment of the present invention is not limited to these expressions that are just examples. Here, X, Y, Z1, and Z2 each denote an object (e.g., a device, an element, a circuit, a wiring, an electrode, a terminal, a conductive film, and a layer).

In this specification, terms for describing arrangement, such as "over" and "under," are used for convenience for describing the positional relation between components with reference to drawings. The positional relation between components is changed as appropriate depending on a direction in which each component is described. Thus, there is no limitation on terms used in this specification, and description can be made appropriately depending on the situation.

Note that the layout of circuit blocks in a block diagram in a drawing specifies the positional relation for description. Thus, even when a drawing shows that different functions are achieved in different circuit blocks, an actual circuit block may be configured so that the different functions are achieved in the same circuit block. The functions of circuit blocks in diagrams are specified for description, and even in the case where one circuit block is illustrated, blocks might be provided in an actual circuit block so that processing performed by one circuit block is performed by a plurality of circuit blocks.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.
(Embodiment 1)

In this embodiment, a structure example of a display device and the operation of the display device is described.

In this specification and the like, a display device refers to a device including a display element such as a liquid crystal element. Note that the display device also includes a driver circuit for driving a plurality of pixels, and the like. The display device may also be referred to as a display module including a control circuit, a power supply circuit, a signal generation circuit, a backlight module, and the like provided over another substrate.

<Cross-Sectional Schematic View of Display Device>

FIG. 1A is a cross-sectional schematic view of a display device of one embodiment of the present invention. The display device can be broadly divided into a liquid crystal panel 41 and a touch sensor 42.

The liquid crystal panel 41 and the touch sensor 42 include components provided between a substrate 10 and a substrate 30. A liquid crystal layer 20 is provided between the substrate 10 and the substrate 30.

First, a structure on the liquid crystal panel 41 side is described.

A transistor 11, a capacitor 12, and an electrode 13 are provided over the substrate 10. Note that the electrode is formed using a conductive layer. In the description below, the terms "electrode" and "conductive layer" are selectively used for the convenience of description; however, in some cases, an electrode is referred to as a conductive layer or a conductive layer is referred to as an electrode.

The transistor 11 has a function as a switch. The transistor 11 can switch electrical connection between a source line (a conductive layer 18) and the electrode 13.

The transistor 11 includes a conductive layer 14, an insulating layer 16, a semiconductor layer 17, the conductive layer 18, and a conductive layer 19. The conductive layer 14 functions as a gate electrode. The insulating layer 16 has a function as a gate insulating film. The semiconductor layer 17 has a function as a semiconductor layer including a channel formation region. The conductive layer 18 has a function as a source electrode or a drain electrode. The conductive layer 19 has a function as a source or a drain electrode. The conductive layer 19 is a part of the capacitor 12 and the conductive layer 19 is connected to the electrode 13.

Although the conductive layer 14, the insulating layer 16, the semiconductor layer 17, the conductive layer 18, or the conductive layer 19 is a single layer in FIG. 1A, any of them may be a stack of two or more layers. The layers in the stack may be formed using different materials or the same material.

The transistor 11 shown in FIG. 1A is a transistor with a bottom gate structure; however, the structure of the transistor 11 is not limited thereto, and a top gate structure may be used. Furthermore, although a channel etched type is shown in FIG. 1A, a channel protective type may be used.

Note that the transistor 11 is preferably a transistor including an oxide semiconductor in a semiconductor layer (hereinafter, such a transistor is referred to as an OS transistor). The use of an OS transistor as the transistor 11 can reduce the off-state current of the transistor 11 that flows between the source and the drain when the transistor 11 is off. Therefore, the electrode 13 can be brought into an electrically floating state easily. Furthermore, the electrode 13 can hold a potential corresponding to image data continuously.

The capacitor 12 includes a conductive layer 15, the insulating layer 16, and the conductive layer 19. The capacitor 12 is denoted by Cpix in drawings. The conductive layer 15 has a function as one electrode of the Cpix. CL denotes a signal supplied to the conductive layer 15. The conductive layer 19 has a function as the other electrode of the Cpix. The insulating layer 16 is provided between the conductive layer 15 and the conductive layer 19. The conductive layer 19 is connected to the transistor 11 and the electrode 13.

The capacitor 12 may include a conductive layer having a light-transmitting property. Such a structure can increase the aperture ratio of a pixel. By the increase in the aperture ratio, display with the same luminance is possible even when light from a backlight is weakened, so that low power consumption can be achieved.

The electrode 13 has a function as a pixel electrode of the liquid crystal layer 20. The electrode 13 may be formed using a light-transmitting material or a reflective material. Vpix denotes a potential of the electrode 13. The electrode 13 is connected to the transistor 11 and the capacitor 12 with the conductive layer 19.

The liquid crystal layer 20 includes a vertical electric field mode liquid crystal layer. Typical examples of the vertical electric field mode liquid crystal layer include a twisted nematic (TN) liquid crystal layer, a super twisted nematic (STN) liquid crystal layer, a vertical alignment (VA) liquid crystal layer, and a multi-domain vertical alignment (MVA) liquid crystal layer. Hereinafter, in one embodiment of the present invention, description will be made using a TN mode liquid crystal layer.

An electric field is generated between the electrode 13 and an electrode 33 on the substrate 30 side. The electrode 33 has a function as a counter electrode. The electric field is denoted by $V_{LC}$ in drawings. The orientation of liquid crystal molecules included in the liquid crystal layer 20 can be controlled by $V_{LC}$. Note that a structure in which the liquid crystal layer 20 is provided between the electrodes 13 and 33 is also referred to as a liquid crystal element.

The above is the description on the liquid crystal panel 41 side.

Next, a structure on the touch sensor 42 side is described.

A transistor 31, a capacitor 32, the electrode 33, and an electrode 37 are provided over the substrate 30.

The transistor 31 has a function as a switch. The transistor 31 can switch electrical connection between a wiring (a conductive layer 38) and the electrode 37.

The transistor 31 includes a conductive layer 34, an insulating layer 35, a semiconductor layer 36, the conductive layer 38, and a conductive layer 39. The conductive layer 34 functions as a gate electrode. The insulating layer 35 has a function as a gate insulating film. The semiconductor layer 36 has a function as a semiconductor layer including a channel formation region. The conductive layer 38 has a function as a source electrode or a drain electrode. The conductive layer 39 has a function as a source electrode or a drain electrode. The conductive layer 39 is connected to the electrode 37.

The transistor 31 can be modified in a manner similar to that of the transistor 11; for example, a structure other than the bottom gate structure may be used, and each layer may be a stack.

Note that the transistor 31 is preferably an OS transistor like the transistor 11. When an OS transistor is used as the transistor 31, the electrode 37 can be brought into an electrically floating state easily. Furthermore, a potential supplied to the electrode 37 can be continuously held by the electrode 37.

Furthermore, in the case where the transistor 31 is an OS transistor, the electrode 37 provided in the same layer as the semiconductor layer 36 can be formed using the same material as the semiconductor layer 36. The electrode 37 can be formed using an oxide semiconductor, in which case the electrode 37 can be changed to the electrode 37 having conductivity after the semiconductor layer 36 is formed.

The capacitor 32 includes the electrode 37 and the electrode 33. The capacitor 32 is denoted by Cs in drawings. The electrode 37 has a function as one electrode of the Cs. FN denotes a potential of the electrode 37. The electrode 33 has a function as the other electrode of the Cs. A color filter (not shown), an interlayer insulating layer, and other components are provided between the electrode 33 and the electrode 37. The electrode 37 is connected to the transistor 31.

Note that the electrode 37 is formed in the same layer as the semiconductor layer 36. The electrode 37 is formed at the same time as the semiconductor layer 36, and then, conductivity is imparted to the electrode 37. Such a structure enables the manufacturing cost to be reduced. Furthermore, the electrode 37 has a light-transmitting property. Therefore, the electrode 37 is not limited to a structure in which the electrode 37 is provided in the same layer as the semiconductor layer 36. For example, a structure in which the electrode 37 is formed using a light-transmitting conductive layer and is provided so as to be connected to the transistor 31 may be used.

Note that the electrodes 37 are arranged in a matrix. Note that the electrode 37 is several millimeters square. The electrode 37 is designed so as to occupy a larger area than that of the electrode 13 functioning as a pixel electrode. One of the electrodes 37 overlaps with a plurality of electrodes 13.

The electrode 33 has a function as the counter electrode of the liquid crystal layer 20. The electrode 33 has a light-transmitting property. COM denotes a signal supplied to the electrode 33.

Note that the electrode 33 is provided to overlap with a plurality of electrodes 37 and the transistor 31. The electrode 33 may be divided by a light-blocking layer.

The above is the description of the touch sensor 42 side.

The operation is described using the cross-sectional schematic view of the display device that is shown in FIG. 1A, and advantages of one embodiment of the present invention are described in detail. The display device shown in FIG. 1A has a function as a capacitive type touch sensor. Therefore, in FIG. 1A, a capacitance generated between the electrode 37 and an object to be detected is denoted by Cf. In the case where the Cf exists, it is determined that the display device is touched. In the case where the Cf does not exist, it is determined that the display device is not touched.

Figure 1B:
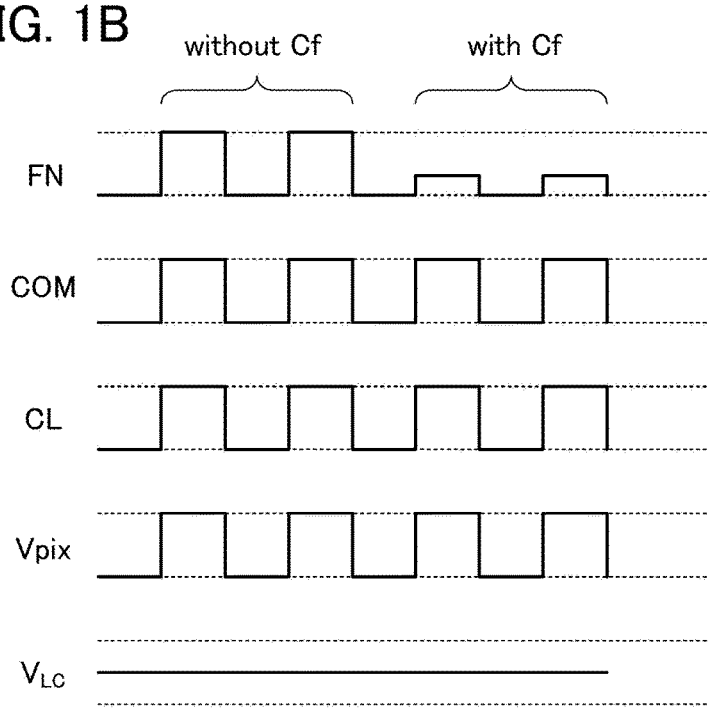

FIG. 1B illustrates changes in the potential FN of the electrode 37, the signal COM supplied to the electrode 33, the signal CL supplied to the conductive layer 15, the potential Vpix of the electrode 13, and the electric field $V_{LC}$ when the Cf exists and when the Cf does not exist.

The case where the Cf does not exist, i.e., the case where the display device is not touched is described.

First, the transistor 31 is turned on and the potential FN is set to a predetermined potential. Then, the transistor 31 is turned off to make the electrode 37 in an electrically floating state. The electrode 37 in an electrically floating state enables the potential FN to follow a change in the signal COM, owing to the capacitive coupling of the Cs. In the case where the Cf does not exist, a parasitic capacitance of the electrode 37 is small. Therefore, for example, by making the signal COM oscillate at regular intervals as shown in FIG. 1B, a change in the potential FN that follows the change in the signal COM can be detected ("without Cf").

The case where the Cf exists, i.e., the case where the display device is touched is described.

The case where the Cf exists is similar to the case where the Cf does not exist, but differs from the case where the Cf does not exist in that the parasitic capacitance of the electrode 37 is increased. In this case, a change in the potential FN following the change in the signal COM is decreased by the amount of increase in the Cf and the change is detected ("with CF") even when the signal COM is made to oscillate at regular intervals.

Regardless of the existence of the Cf, the signal COM is changed to detect a touch, which changes the electric field $V_{LC}$. When the electric field $V_{LC}$ is changed, liquid crystal molecules in the liquid crystal layer 20 cannot be oriented favorably, which leads to low display quality.

Therefore, in one embodiment of the present invention, the signal CL to be supplied to the conductive layer 15 is changed in conjunction with the change in the signal COM.

Note that when the signal CL is changed, the potential Vpix is made in an electrically floating state. Specifically, the transistor 11 is turned on and the potential Vpix is set to a potential corresponding to image data. Then, the transistor 11 is turned off to make the electrode 13 in an electrically floating state. The electrode 13 in an electrically floating state allows the potential Vpix to follow the change in the signal CL owing to the capacitive coupling of the Cpix.

The potential Vpix can be changed by the change in the signal CL. The signal CL is changed so that a change in the electric field $V_{LC}$ due to a change in potential by the signal COM is canceled by the change in the potential Vpix. Specifically, the signal CL is changed at the same intervals as the signal COM.

The above-described structure enables the potential Vpix to be changed in conjunction with the change in the signal COM so that the electric field $V_{LC}$ is constant. With the constant electric field $V_{LC}$, favorable display quality can be achieved.

Furthermore, according to one embodiment of the present invention, a display element and an element for driving the touch sensor can be provided between the pair of substrates. Thus, components such as another substrate between the pair of substrates can be reduced. This can reduce the thickness of the touch sensor 42.

Note that the display device having the structure described in this embodiment is used as a display device including a liquid crystal element as an example, and the operation of the display device is described; however, one embodiment of the present invention is not limited thereto. One embodiment of the present invention can be used for a display device including a display element other than the liquid crystal element depending on circumstances or conditions. Examples of the display element other than the liquid crystal element include a light-emitting element and an electrophoresis element.

In the example described in this embodiment, the transistors each include an oxide semiconductor; however, one embodiment of the present invention is not limited thereto. Depending on circumstances, a transistor which includes a semiconductor material that is not an oxide semiconductor may be employed in one embodiment of the present invention in some cases. As such a transistor, for example, a transistor including silicon or germanium may be employed in one embodiment of the present invention.

Note that the structures, methods, and the like described in this embodiment can be used as appropriate in combination with any of the structures, methods, and the like described in the other embodiments.

(Embodiment 2)

In this embodiment, a modification example of the display device in Embodiment 1 is described.

<Modification Example of Cross-Sectional Schematic View (Display Panel)>

Figure 2:
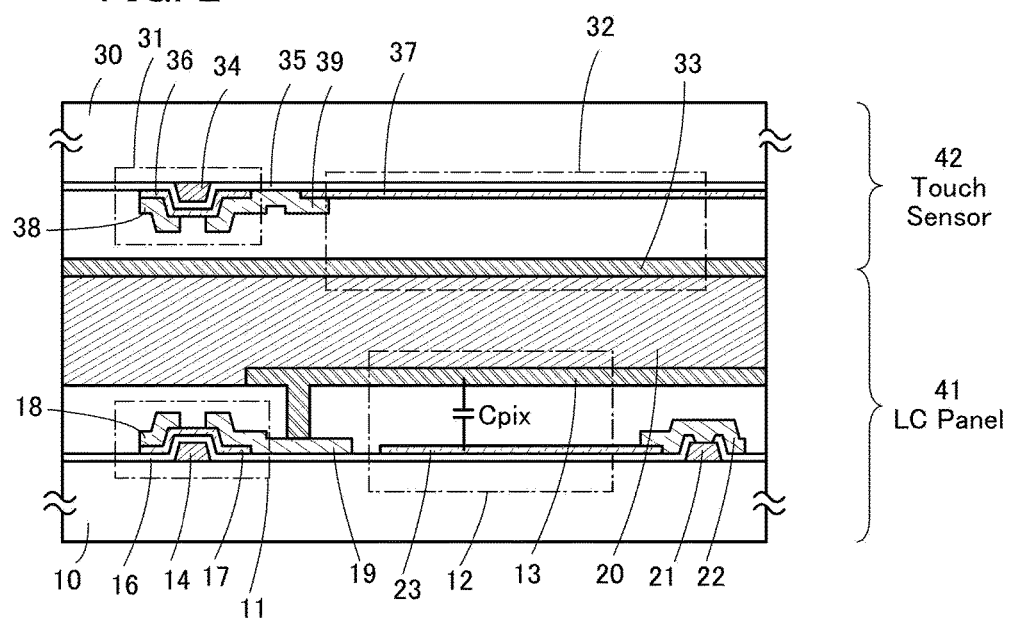
FIG. 2 is a cross-sectional schematic view for illustrating one embodiment of the present invention.

FIG. 2 shows a modification example of the cross-sectional schematic view described using FIG. 1A.

In FIG. 1A, the Cpix includes the conductive layer 15 and the conductive layer 19; however, another structure may be used. For example, a structure shown in FIG. 2 can be used.

In FIG. 2, an electrode 23 connected to a conductive layer 21 through a conductive layer 22 is used as one electrode of the Cpix.

The conductive layer 21 is formed in the same layer as the conductive layer 14. The conductive layer 22 is formed in the same layer as the conductive layers 18 and 19. The electrode 23 is formed in the same layer as the semiconductor layer 17.

Furthermore, in the case where the transistor 11 is an OS transistor, the electrode 23 provided in the same layer as the semiconductor layer 17 can be formed using the same material as the semiconductor layer 17. In this case, the electrode 23 is formed by processing a film formed at the same time as the semiconductor layer 17. Therefore, the electrode 23 and the semiconductor layer 17 include similar elements. Furthermore, the electrode 23 has a crystal structure similar to or different from that of the semiconductor layer 17. By adding impurities to or forming oxygen vacancies in the film formed at the same time as the semiconductor layer 17, the film can have conductivity. As a result, the film formed at the same time as the semiconductor layer 17 becomes the electrode 23. Typical examples of the impurities included in the electrode 23 are one or more of a rare gas, hydrogen, boron, nitrogen, fluorine, aluminum, and phosphorus. Typical examples of the rare gas are helium, neon, argon, krypton, and xenon.

The semiconductor layer 17 and the electrode 23 are both formed over the insulating layer 16, but differ in impurity concentration. Specifically, the electrode 23 has a higher impurity concentration than the semiconductor layer 17. For example, in the semiconductor layer 17, the hydrogen concentration measured by secondary ion mass spectroscopy is less than or equal to $5\times10^{19}$ atoms/cm$^3$, preferably less than or equal to $5\times10^{18}$ atoms/cm$^3$, preferably less than or equal to $1\times10^{18}$ atoms/cm$^3$, preferably less than or equal to $5\times10^{17}$ atoms/cm$^3$, preferably less than or equal to $1\times10^{16}$ atoms/cm$^3$. In the electrode 23, the hydrogen concentration measured by secondary ion mass spectrometry is greater than or equal to $8\times10^{19}$ atoms/cm$^3$, preferably greater than or equal to $1\times10^{20}$ atoms/cm$^3$, preferably greater than or equal to $5\times10^{20}$ atoms/cm$^3$. The concentration of hydrogen contained in the electrode 23 is greater than or equal to 2 times or greater than or equal to 10 times that of hydrogen contained in the semiconductor layer 17.

By setting the hydrogen concentration of the semiconductor layer 17 in the range described above, generation of electrons serving as carriers in the semiconductor layer 17 can be suppressed.

The electrode 23 has lower resistivity than the semiconductor layer 17. The resistivity of the electrode 23 is preferably greater than or equal to $1\times10^{-8}$ times and less than $1\times10^{-1}$ times that of the semiconductor layer 17. The resistivity of the electrode 23 is typically greater than or equal to $1\times10^{-3}$ Ωcm and less than $1\times10^{4}$ Ωcm, or greater than or equal to $1\times10^{-3}$ Ωcm and less than $1\times10^{-1}$ Ωcm.

As the structure of the electrode 23, the electrode 23 is formed at the same time as the semiconductor layer 17, and then, conductivity is impaired to the electrode 23. Thus, the manufacturing cost can be reduced.

Furthermore, the electrode 13 and the electrode 23 have a light-transmitting property. The Cpix can be a capacitor having a light-transmitting property. Because of having a light-transmitting property, the Cpix can have a large capacitance.

In another structure, a color filter may be provided on the liquid crystal panel 41 side in FIG. 1A.

Figure 3:
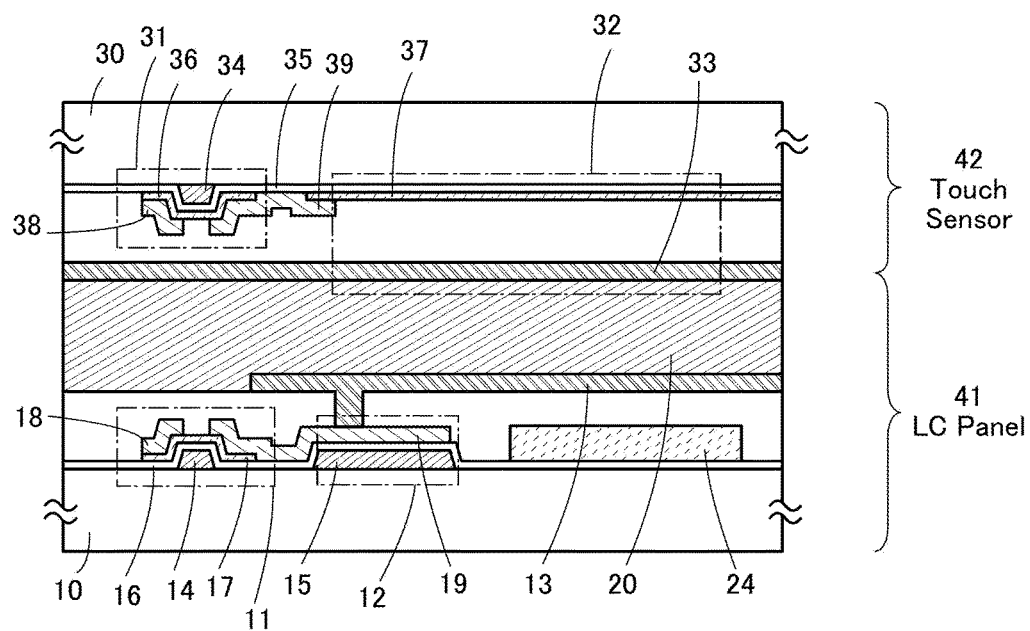
FIG. 3 is a cross-sectional schematic view for illustrating one embodiment of the present invention.

FIG. 3 shows a structure in which a color filter 24 is provided on the liquid crystal panel 41 side. This structure enables a component on the touch sensor 42 side to be reduced, improving the flatness of a surface of the electrode 33.

Figure 17:
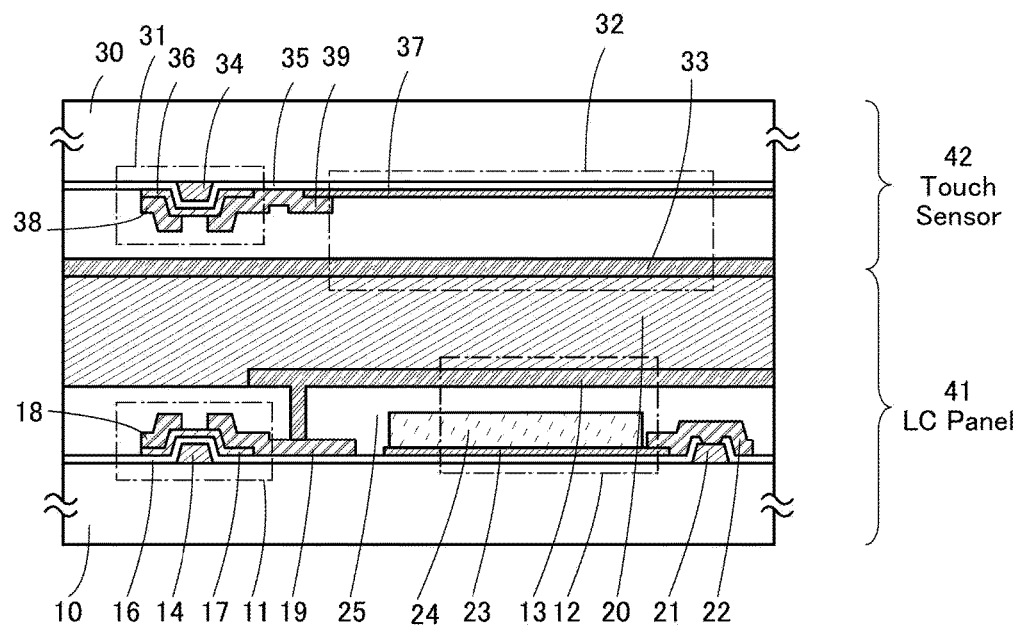
FIG. 17 is a cross-sectional schematic view for illustrating one embodiment of the present invention.

Note that the structure of FIG. 2 in which the electrode 23 is used as one electrode of the Cpix may be used for the structure of FIG. 3. FIG. 17 shows a structure of a cross-sectional schematic view of this case.

<Modification Example of Cross-Sectional Schematic View (Touch Sensor)>

Figure 4:
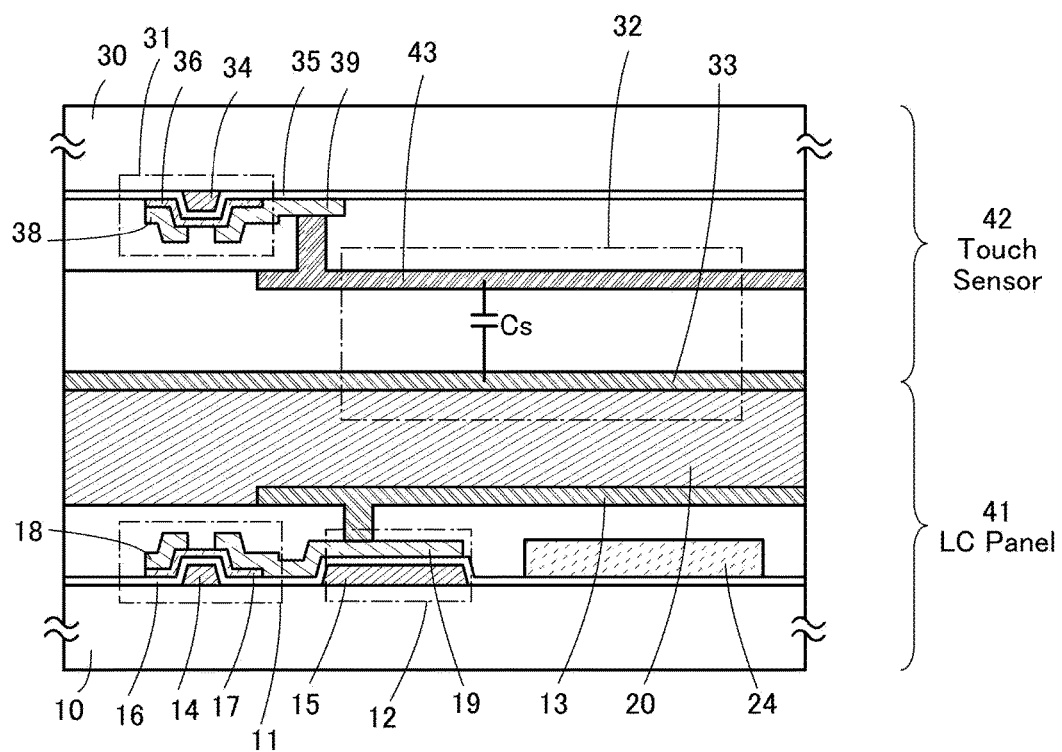
FIG. 4 is a cross-sectional schematic view for illustrating one embodiment of the present invention.

As another structure, a modification example of the cross-sectional schematic view described using FIG. 1A is shown in FIG. 4.

In FIG. 1A, the Cs includes the electrode 37 and the electrode 33, but another structure may be used. For example, the structure shown in FIG. 4 may be used.

In the structure shown in FIG. 4, an electrode 43 that is separately provided is used as one electrode of the Cs, and the Cs includes the electrode 43 and the electrode 33. This structure enables the Cs and the transistor 31 to be formed in different layers. Consequently, the Cs can have a large capacitance.

Note that the electrode 43 is a conductive layer having a light-transmitting property. For example, the electrode 43 can be formed using the same material as the electrode 13.

As another structure, a color filter may be provided on the touch sensor 42 side in FIG. 1A.

Figure 5:
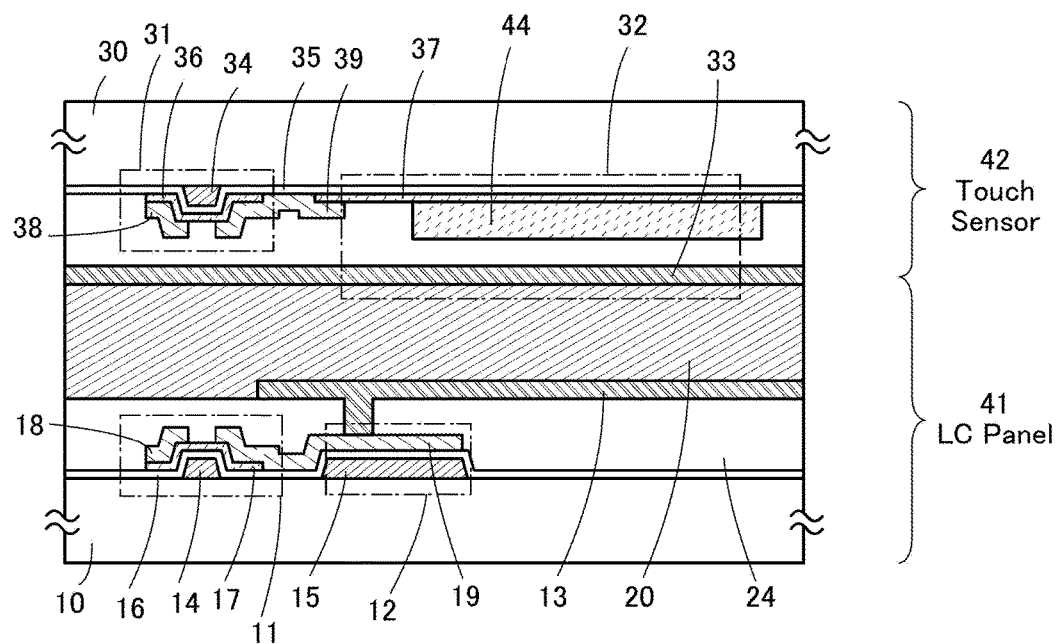
FIG. 5 is a cross-sectional schematic view for illustrating one embodiment of the present invention.

FIG. 5 shows a structure in which a color filter 44 is provided on the touch sensor 42 side. In this structure, a planarization film or the like is preferably provided between the color filter 44 and the electrode 33 to ensure the flatness of the surface of the electrode 33.

Figure 18:
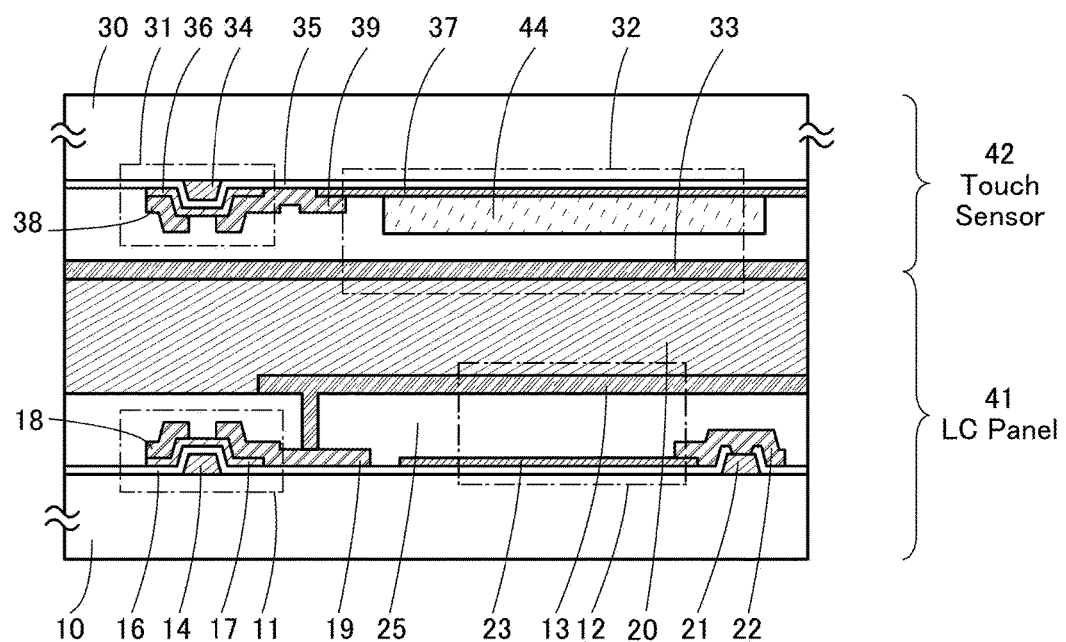
FIG. 18 is a cross-sectional schematic view for illustrating one embodiment of the present invention.

Note that the structure of FIG. 2 in which the electrode 23 is used as one electrode of the Cpix may be used for the structure of FIG. 5. FIG. 18 shows a structure of a cross-sectional schematic view of this case.

<Circuit Diagram of Liquid Crystal Panel and Touch Sensor>

Next, an example of a circuit including a pixel circuit of the liquid crystal panel 41 including the transistor 11 shown in FIG. 1A and a circuit configuration of the touch sensor 42 including the transistor 31 shown in FIG. 1A and an example of the operation of the circuit are described.

Figure 6:
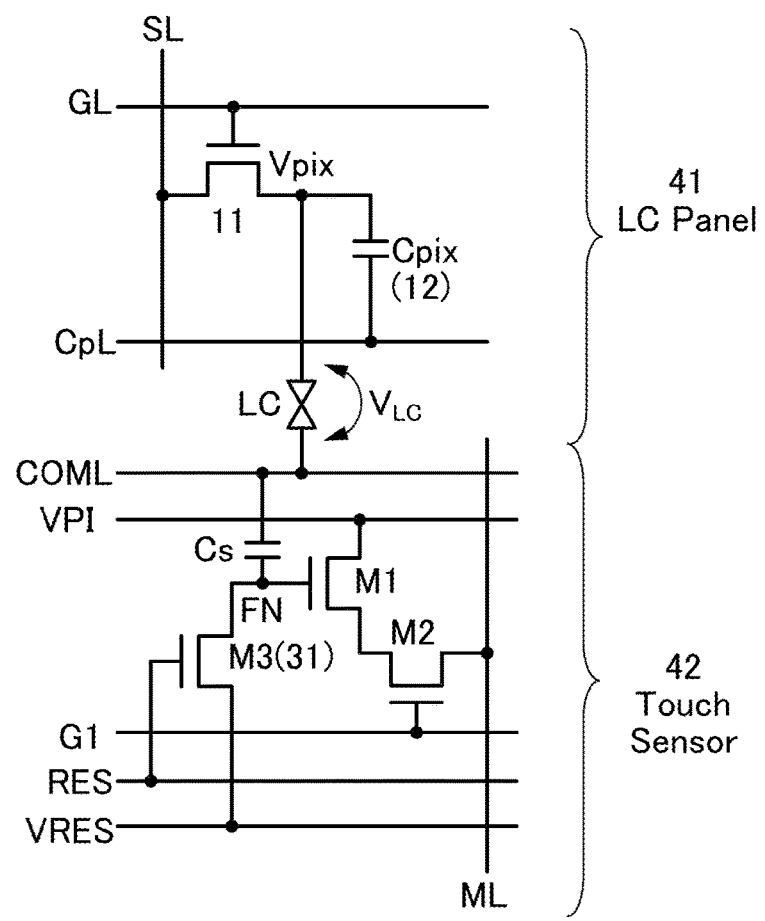
FIG. 6 is a circuit diagram for illustrating one embodiment of the present invention.

FIG. 6 is a circuit diagram in which a pixel circuit diagram of the liquid crystal panel 41 and a circuit diagram of the touch sensor 42 are combined. The pixel circuit diagram of the liquid crystal panel 41 and the circuit diagram of the touch sensor 42 are shown in the upper side and the lower side of FIG. 6, respectively, with a liquid crystal element LC provided therebetween.

In the circuit diagram of the liquid crystal panel 41 side, symbols shown in the structure of FIG. 1A are used. Furthermore, a gate line GL, a source line SL, and a capacitor line CpL are shown in FIG. 6. The capacitor line CpL is supplied with the signal CL.

In the circuit diagram of the touch sensor 42, symbols shown in the structure of FIG. 1A are used. Furthermore, transistors M1 to M3, a common line COML, a wiring to be supplied with a read potential VPI, which is a constant potential, a wiring to be supplied with a reset potential VRES, a reset line RES, a read selection line G1, and a read line ML are shown in FIG. 6. The common line COML is a wiring to be supplied with the signal COM. The transistor M3 corresponds to the transistor 31 shown in FIG. 1A.

Figure 7:
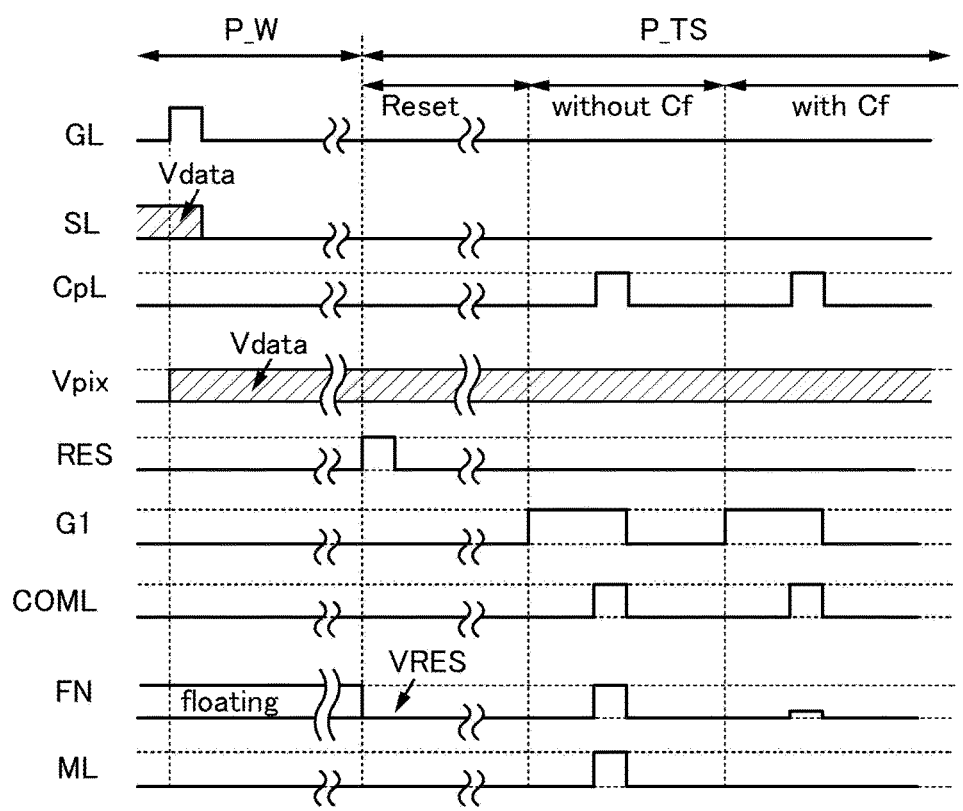
FIG. 7 is a timing chart for illustrating one embodiment of the present invention.

FIG. 7 shows an example of a timing chart of the circuit diagram shown in FIG. 6.

In FIG. 7, a period P_W in which image data (Vdata) is written and a period P_TS in which an object is detected are separately described. Furthermore, the period P_TS is divided into a reset period Reset, a non-detection period (not touched: "without Cf"), and a detection period (touched: "with Cf").

In the description below, each transistor is regarded as an n-channel transistor. In this case, the transistor is turned on when supplied with an H level signal, and the transistor is turned off when supplied with a L level signal. Note that in the description below, when the potential FN of the electrode 37 becomes the reset potential VRES, the potential FN is regarded as L level.

First, the period P_W is described.

In the period P_W, the gate line GL is set at H level so that the Vpix is equal to Vdata supplied to the source line SL. In the period, each signal in the touch sensor is set at L level, and the electrode 37 is in an electrically floating state.

The Vpix is set to Vdata, and the gate line GL is set at L level. Vdata is held by the Vpix because the off-state current of the transistor 11 is low.

Next, the period P_TS is described.

In the reset period Reset, the reset line RES is set at H level so that the potential FN of the electrode 37 is equal to VRES.

The reset line RES is set at L level. VRES is held at the electrode 37 because the off-state current of the transistor M3 is low.

In the non-detection period "without Cf" and the detection period "with Cf", the read selection line G1 is set at H level. Furthermore, signals supplied to the common line COML and the capacitor line CpL are changed at the same intervals. Under these conditions, changes in the potential FN of the electrode 37 differ depending on the existence or nonexistence of the Cf, as described using FIG. 1B. The difference is shown as the conduction state of the transistor M1. That is, the transistor M1 is turned on when the Cf does not exist, and the transistor M1 is turned off when the Cf exists.

In the case where the transistors M2 and M1 are on, the potential of the read line ML is changed and current flows. In this case, it is determined that Cf does not exist. In the case where the transistor M2 is on and the transistor M1 is off, the potential of the read line ML is not changed and current does not flow. In this case, it is determined that Cf exists.

Figure 8:
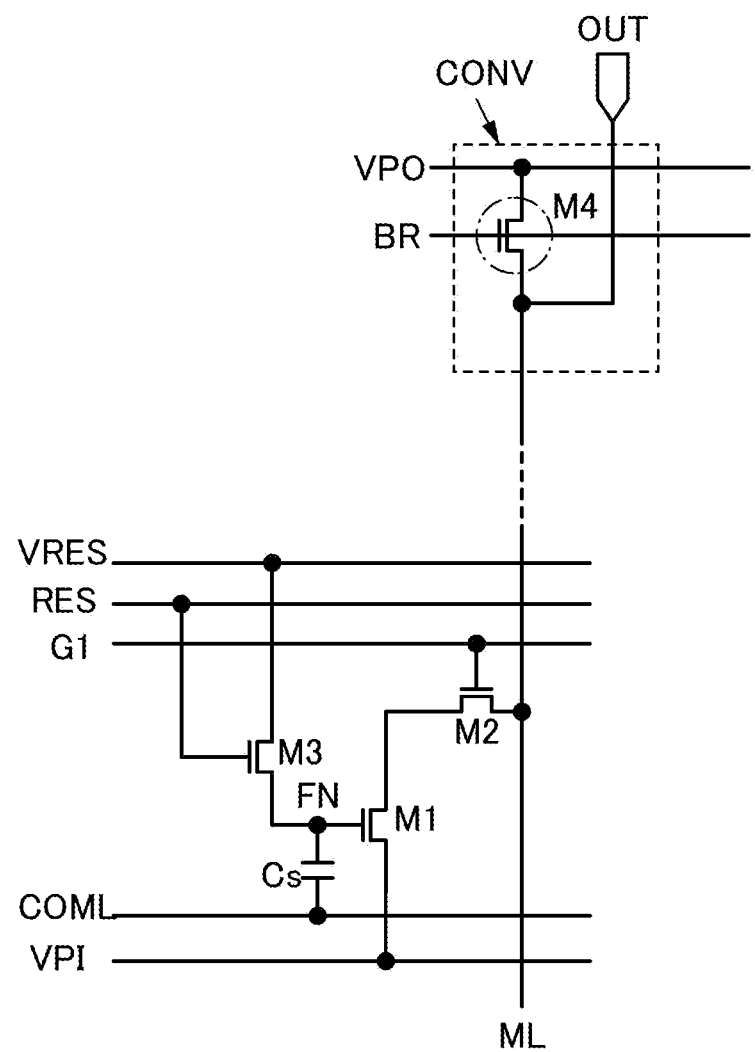
FIG. 8 is a circuit diagram for illustrating one embodiment of the present invention.

FIG. 8 is a circuit diagram of a read circuit in which current flowing in the read line ML is converted into voltage.

FIG. 8 shows an example of a read circuit CONV in addition to the circuit diagram of the touch sensor described using FIG. 6. The read circuit CONV includes a transistor M4.

The read circuit CONV including the transistor M4 functions as a source follower. A potential VPO is a high power supply potential. A signal BR is controlled so that the transistor M4 is turned on at the time when the potential of the read line ML is read. At an output terminal OUT, a current flowing in the touch sensor can be converted into a voltage depending on a current flowing in the transistor M4.

Note that in the touch sensor, the electrode included in the capacitor Cs and the read line ML can be formed in different layers.

Figure 9:
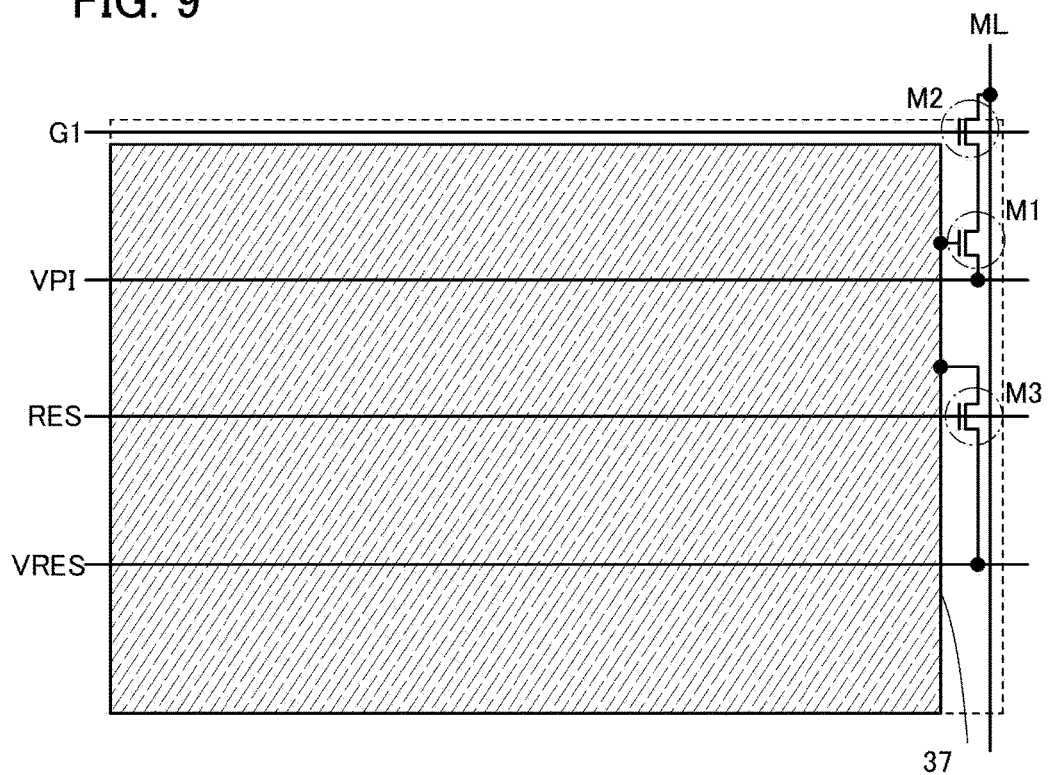
FIG. 9 is a top view for illustrating one embodiment of the present invention.

For example, as shown in FIG. 9, one electrode 37 of the capacitor and the read line ML are formed in different layers, and the width of the read line ML is made narrow. The structure enables a parasitic capacitance to be small. Accordingly, a decrease in the detection sensitivity of the touch sensor can be suppressed.

In the structure of one embodiment of the present invention, the signals supplied to the common line COML and the capacitor line CpL are changed at the same intervals. Therefore, Cf can be detected without changing Vdata applied to the liquid crystal element LC. The disorder of orientation does not occur in the liquid crystal element, resulting in favorable display quality.

Note that the structures, methods, and the like described in this embodiment can be used as appropriate in combination with any of the structures, methods, and the like described in the other embodiments.

(Embodiment 3)

In this embodiment, a cross-sectional view of the display device described in Embodiments 1 and 2 is described in detail.

<Cross-Sectional Structure Example of Touch Panel>

Figure 10:
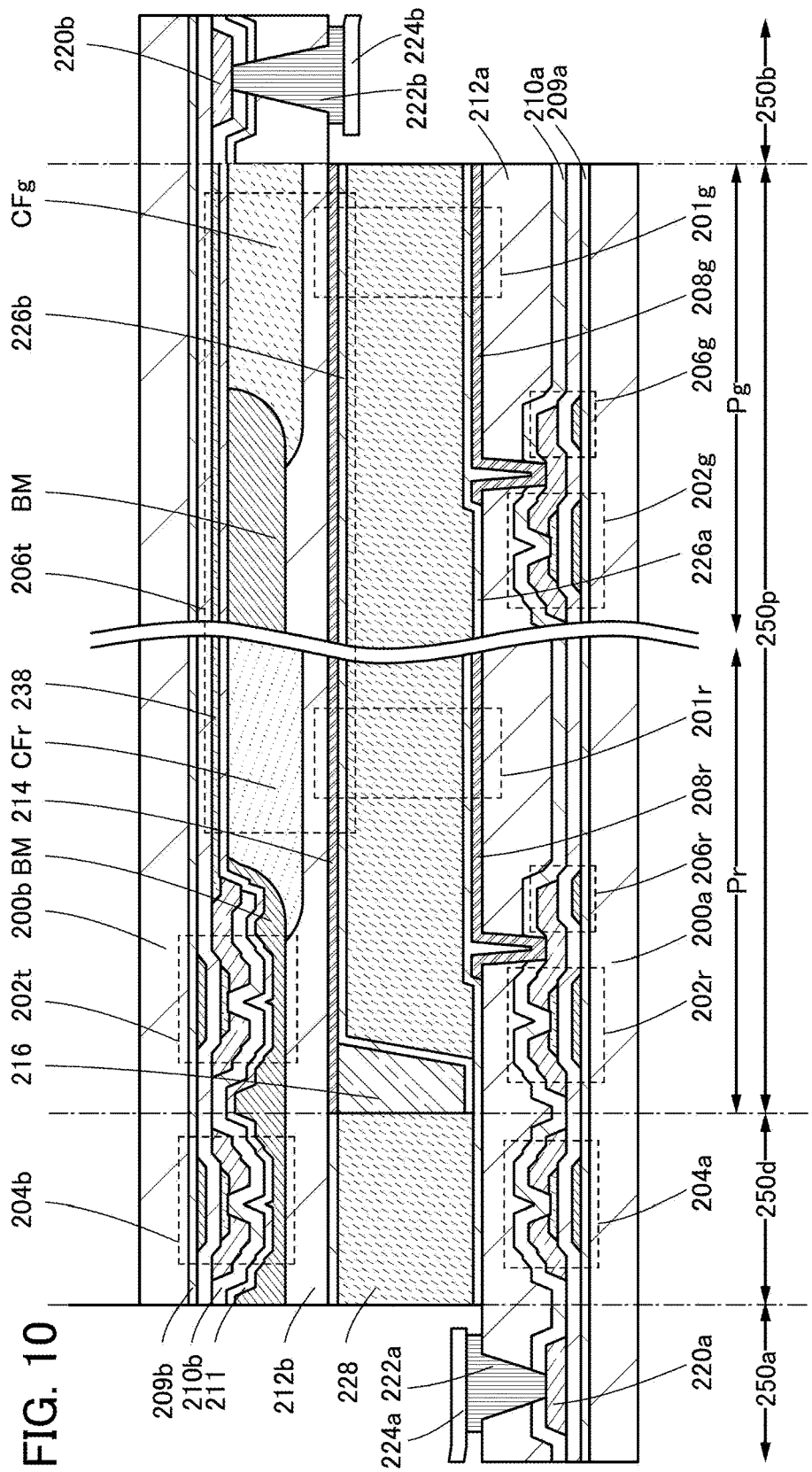
FIG. 10 is a cross-sectional schematic view for illustrating one embodiment of the present invention.

FIG. 10 is a cross-sectional schematic view of the display device of one embodiment of the present invention. In the display device illustrated in FIG. 10, a touch sensor and a liquid crystal element are provided between a pair of substrates, so that the display device can be thin.

FIG. 10 is a cross-sectional view of terminal portions 250a and 250b, a driver circuit portion 250d, and a pixel portion 250p which are included in the display device. In the pixel portion 250p, pixels of three colors of red (R), green (G), and blue (B) express one color. Note that in the cross-sectional view illustrated here, a pixel Pr of red (R) and a pixel Pg of green (G) are shown in the pixel portion 250p, and a pixel of blue (B) is not shown. The pixel Pr of red (R) includes a liquid crystal element 201r, and the pixel Pg of green (G) includes a liquid crystal element 201g.

In the display device, a liquid crystal panel and the touch sensor are stacked. Driver circuits included in the liquid crystal panel and the touch sensor overlap with each other in the driver circuit portion 250d. Furthermore, the liquid crystal element in the liquid crystal panel and a transistor and a capacitor in the touch sensor overlap with each other in the pixel portion 250p.

Note that the display device can have a structure in which pixels of three colors of red (R), green (G), and blue (B), for example, express one color, a structure in which pixels of four colors of red (R), green (G), blue (B), and white (W) express one color, a structure in which pixels of four colors of red (R), green (G), blue (B), and yellow (Y) express one color, or the like. There is no particular limitation on color elements, and colors other than R, G, B, W, and Y may be used. For example, cyan or magenta may be included.

First, a structure on the liquid crystal panel side is described. The liquid crystal panel includes the terminal portion 250a, the driver circuit portion 250d, and the pixel portion 250p including the liquid crystal element.

Transistors 202r, 202g, and 204a, capacitors 206r and 206g, electrodes 208r and 208g, and a connection electrode 220a are provided over a substrate 200a. The connection electrode 220a is provided in the terminal portion 250a. The transistor 204a is provided in the driver circuit portion 250d. The transistor 202r, the capacitor 206r, and the electrode 208r are provided in the pixel Pr of red (R). The transistor 202g, the capacitor 206g, and the electrode 208g are provided in the pixel Pg of green (G).

The transistors 202r and 202g each have a function as a switch. The transistors 202r and 202g may have the same structure or different structures. The capacitors 206r and 206g may have the same structure or different structures.

The transistors 202r, 202g, and 204a shown in FIG. 10 are transistors with a bottom gate structure; however, the structures of the transistors 202r, 202g, and 204a are not limited thereto, and a top gate structure may be used. Furthermore, although a channel etched type is shown in FIG. 10, a channel protective type may be used.

An insulating layer 210a is provided over the transistors 202r, 202g, and 204a, and an insulating layer 212a is provided over the insulating layer 210a.

The insulating layer 210a has a function of protecting channel regions of the transistors. Note that a structure in which the insulating layer 210a is not provided may be employed.

The insulating layer 212a has a function as a planarization film. The insulating layer 212a is formed using a heat-resistant organic material, such as a polyimide resin, an acrylic resin, a polyimide amide resin, a benzocyclobutene resin, a polyamide resin, or an epoxy resin. Note that the insulating layer 212a may be formed by stacking a plurality of insulating films formed using any of these materials. Note that a structure in which the insulating layer 212a is not provided may be employed.

The electrode 208r has a function as a pixel electrode of the liquid crystal element 201r, and the electrode 208g has a function as a pixel electrode of the liquid crystal element 201g. The electrodes 208r and 208g are formed over the insulating layer 212a. The electrode 208r is electrically connected to the transistor 202r and the capacitor 206r in an opening portion in the insulating layers 210a and 212a. The electrode 208g is electrically connected to the transistor 202g and the capacitor 206g in an opening portion in the insulating layers 210a and 212a.

For the electrodes 208r and 208g, a conductive film that transmits visible light or a conductive film that reflects visible light is used. For example, a material including at least one kind selected from indium (In), zinc (Zn), and tin (Sn) is preferably used for the conductive film that transmits visible light. Typically, a conductive oxide such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide can be used. For the conductive film that reflects visible light, a material containing aluminum or silver can be used, for example.

Note that in the case where the electrodes 208r and 208g are formed using the conductive film that reflects visible light and part of the insulating layer 212a has an uneven shape, the electrodes 208r and 208g have an uneven shape. As a result, external light incident on the electrodes 208r and 208g can be diffusely reflected by surfaces of the electrodes 208r and 208g, so that high visibility can be achieved.

The orientation of the liquid crystal molecules included in the liquid crystal layer 228 can be controlled by an electric field generated between an electrode 214 provided for a substrate 200b and the electrodes 208r and 208g.

The liquid crystal layer 228 has a vertical electric field mode liquid crystal layer. Typical examples of the vertical electric field mode liquid crystal layer include a twisted nematic (TN) mode liquid crystal layer, a super twisted nematic (STN) mode liquid crystal layer, a vertical alignment (VA) mode liquid crystal layer, and a multi-domain vertical alignment (MVA) mode liquid crystal layer. Hereinafter, in one embodiment of the present invention, the vertical electric field mode liquid crystal layer is regarded as a TN mode liquid crystal layer.

For the liquid crystal layer 228, thermotropic liquid crystal, low-molecular liquid crystal, high-molecular liquid crystal, polymer dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

The connection electrode 220a, an anisotropic conductive film 222a, and an FPC 224a are provided in the terminal portion 250a. Note that the connection electrode 220a is formed in the same process as conductive layers having a function as source electrodes and drain electrodes of the transistors 202r, 202g, and 204a. The connection electrode 220a is electrically connected to a terminal included in the FPC 224a through the anisotropic conductive film 222a.

Next, a structure on the touch sensor side is described.

Transistors 202t and 204b, a capacitor 206t, and a connection electrode 220b are provided over a substrate 200b. The connection electrode 220b is provided in the terminal portion 250b. The transistor 204b is provided in the driver circuit portion 250d. The transistor 202t and the capacitor 206t that are part of a sensor are provided in the pixel portion 250p.

The transistor 202t has a function as a switch.

For the transistor 202t, a structure similar to the structures of the transistors 202r and 202g can be used as appropriate. Alternatively, although a bottom-gate transistor is shown as the transistor 202t in a manner similar to those of the transistors 202r and 202g, the transistor 202t is not limited thereto. The transistor 202t may be a top-gate transistor. Furthermore, although a channel-etched transistor is shown, a channel protective transistor can be used.

An insulating layer 210b is provided on the transistors 202t and 204b, and an insulating layer 211 is provided on the insulating layer 210b. Note that the insulating layer 210b has an opening portion in which an electrode 238 is exposed.

The capacitor 206t includes the electrode 238, a dielectric layer, and the electrode 214. The electrode 238 is connected to the transistor 202t.

Here, the insulating layer 211, a light-blocking layer BM, coloring layers CFr and CFg, and the insulating layer 212b form the dielectric layer of the capacitor 206t. Note that the dielectric layer of the capacitor 206t may include one or more of the insulating layer 211, the light-blocking layer BM, the coloring layers CFr and CFg, and the insulating layer 212b.

The coloring layer CFr is provided in a position overlapping with the liquid crystal element 201r, and the coloring layer CFg is provided in a position overlapping with the liquid crystal element 201g. The light-blocking layers BM are provided in the driver circuit portion 250d in a region overlapping with the transistors 204b and 204a and in the pixel portion 250p in a region overlapping with the transistors 202r, 202g, and 202t. Note that a coloring layer may be provided instead of the light-blocking layer BM.

The light-blocking layer BM blocks light to be emitted to the transistors 202r, 202g, 202t, 204a, and 204b from a backlight and the outside of the display device. As a result, variations in electrical characteristics of the transistors 202r, 202g, 202t, 204a, and 204b due to light irradiation can be suppressed. As the light-blocking layer BM, a material that blocks light from the backlight and the outside of the display device can be used; for example, the light-blocking layer BM may be formed using a metal material or a resin material containing pigment or dye.

The coloring layer is a layer that transmits light in a specific wavelength range. For example, a red (R) coloring layer that transmits light in a red wavelength range, a green (G) coloring layer that transmits light in a green wavelength range, a blue (B) coloring layer that transmits light in a blue wavelength range, and the like can be used. Here, the red (R) coloring layer CFr and the green (G) coloring layer CFg are shown.

The insulating layer 212b has a function as an overcoat layer that covers the light-blocking layer BM and the coloring layers CFr and CFg. The insulating layer 212b can prevent impurities or the like contained in the light-blocking layer BM and the coloring layers CFr and CFg from diffusing into the liquid crystal layer 228. The insulating layer 212b may be formed using a light-transmitting material. For example, an inorganic insulating film using silicon nitride, silicon oxide, or the like, or an organic insulating film using an acrylic resin, polyimide, or the like may be used. Furthermore, a stacked-layer structure of an organic insulating film and an inorganic insulating film may be used.

The electrodes 238 are arranged in a matrix. Note that the area of the electrode 238 can be larger than each area of the electrodes 208r and 208g each having a function as a pixel electrode. For example, one electrode 238 can be provided to overlap with electrodes each of which has a function as a pixel electrode and which are provided in several hundred to several thousand pixels.

The electrode 214 has a function as a counter electrode in each of the liquid crystal elements 201r and 201g. The electrode 214 has a light-transmitting property. For the electrode 214, a material similar to that of the conductive film that transmits visible light can be used as appropriate.

Note that the electrode 214 is provided to overlap with the plurality of electrodes 238 and the transistors 202t arranged in a matrix.

The terminal portion 250b includes the connection electrode 220b, an anisotropic conductive film 222b, and an FPC 224b. Note that the connection electrode 220b is formed in the same process as conductive films having a function as source electrodes and drain electrodes of the transistors 202t and 204b. The connection electrode 220b is electrically connected to a terminal included in the FPC 224b through the anisotropic conductive film 222b.

A spacer 216 is provided between the substrate 200a and the substrate 200b. The spacer 216 is a columnar spacer obtained by selective etching of an insulating film and is provided in order to control the thickness (a cell gap) of the liquid crystal layer 228. Note that a spherical spacer may be used as the spacer 216.

Note that in the liquid crystal panel, an insulating layer 226a having a function as an alignment film is provided over the insulating layer 212a and the electrodes 208r and 208g. Furthermore, in the touch sensor, an insulating layer 226b having a function as an orientation film is provided on the insulating layer 212b and the electrode 214. Note that the insulating layers 226a and 226b are not necessarily provided depending on a liquid crystal material that forms the liquid crystal layer 228.

In the display device, the substrate 200b and the substrate 200a are firmly fixed to each other with a sealing material (not shown). Furthermore, the display device includes the liquid crystal layer 228 in a space surrounded by the substrate 200b, the substrate 200a, and the sealing material.

Note that in each of the structures of the liquid crystal panel and the touch sensor, the driver circuit portion is formed over the substrate 200b and the substrate 200a; however, part of a driver circuit may be formed over the substrate 200b and the substrate 200a, and, as the other part of the driver circuit, a separately prepared driver circuit substrate (e.g., a driver circuit including a single crystal semiconductor film or a polycrystalline semiconductor film) may be mounted over the substrate 200b and the substrate 200a.

There is no particular limitation on the connection method of a separately formed driver circuit substrate; a chip on glass (COG) method, a wire bonding method, or the like can be used. Note that the display device in this specification means an image display device or a light source (including a lighting device or the like). Furthermore, the display device also includes the following modules in its category: a module to which a connector such as an FPC or a tape carrier package (TCP) is attached; a module having a TCP at the tip of which a printed wiring board is provided; and a module in which a driver circuit substrate or an integrated circuit (IC) is directly mounted on a display element by a COG method.

The transistor used in this embodiment includes an oxide semiconductor layer which is highly purified and in which formation of oxygen vacancies is suppressed. Such a transistor can have relatively high field-effect mobility and thus can operate at high speed. For example, with such a transistor which can operate at high speed used for a display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

Note that in FIG. 10, the transistors 202r and 202g in the pixel portion 250p and the transistor 204a in the driver circuit portion 250d have the same size; however, these transistors are not limited thereto. For example, the sizes (L/W) or the number of the transistors used in the pixel portion 250p and the driver circuit portion 250d may vary as appropriate.

Although not shown in FIG. 10, an optical member (an optical substrate) such as a polarizing member, a retardation member, or an anti-reflection member; and the like may be provided as appropriate in the display device. For example, circular polarization may be employed by using a polarizing substrate and a retardation substrate. In addition, a backlight, a side light, a front light, or the like may be used as a light source.

Next, structures of the transistor and the capacitor that are provided for the substrates 200a and 200b are described in detail. Here, the transistor 202r is described as a typical example of the transistor. In addition, an oxide semiconductor layer is used as a semiconductor layer included in the transistor.

<Structures of Transistor 202r and Capacitor 206r>

Figure 11A:
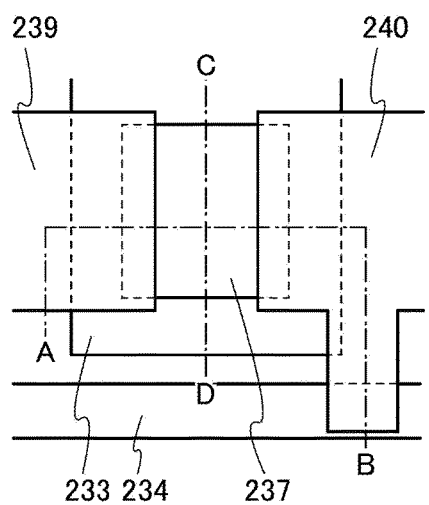
FIGS. 11A to 11C are cross-sectional schematic views for illustrating one embodiment of the present invention.
Figure 11C:
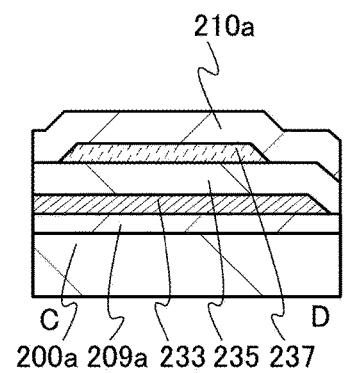
Figure 11B:
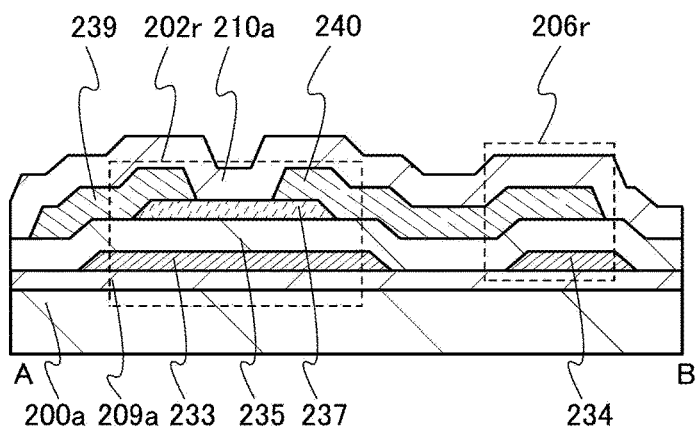

FIGS. 11A to 11C are a top schematic view and cross-sectional schematic views of the transistor 202r and the capacitor 206r. FIG. 11A is a top schematic view of the transistor 202r and the capacitor 206r, FIG. 11B is a cross-sectional schematic view taken along the dashed-dotted line A-B in FIG. 11A, and FIG. 11C is a cross-sectional schematic view taken along the dashed-dotted line C-D in FIG. 11A. Note that in FIG. 11A, the substrate 200a, an insulating layer 209a, an insulating layer 235, the insulating layer 210a, and other components are not shown for the sake of clarity.

The transistor 202r shown in FIGS. 11A to 11C includes a conductive layer 233 that is over the insulating layer 209a and has a function as a gate electrode, the insulating layer 235 that is over the conductive layer 233 and has a function as a gate insulating film, an oxide semiconductor layer 237 that overlaps with the conductive layer 233 with the insulating layer 235 provided therebetween, and a pair of conductive layers 239 and 240 in contact with the oxide semiconductor layer 237. The insulating layer 209a is formed over the substrate 200a. Note that the insulating layer 209a is not necessarily provided over the substrate 200a. Furthermore, the insulating layer 210a having a function as a protective film may be formed over the insulating layer 235, the oxide semiconductor layer 237, and the pair of conductive layers 239 and 240.

There is no particular limitation on the property of a material and the like of the substrate 200a as long as the material has heat resistance enough to withstand heat treatment to be performed later.

A variety of substrates can be used as the substrate 200a to form a transistor, for example. The type of a substrate is not limited to a certain type. As the substrate, a semiconductor substrate (e.g., a single crystal substrate or a silicon substrate), an SOI (Silicon on Insulator) substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, a soda lime glass substrate, or the like can be given. Examples of the flexible substrate, the attachment film, the base material film, or the like are as follows: plastic typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Alternatively, a flexible substrate may be used as the substrate 200a, and the transistor 202r may be provided directly on the flexible substrate. Further alternatively, a separation layer may be provided between the substrate 200a and the transistor 202r. The separation layer can be used when part or the whole of a semiconductor device formed over the separation layer is completed and separated from the substrate 200a and transferred to another substrate. In that case, the transistor 202r can be transferred to a substrate having low heat resistance or a flexible substrate. For the above separation layer, a stack including inorganic films, which are a tungsten film and a silicon oxide film, or an organic resin film of polyimide or the like formed over a substrate can be used, for example.

Examples of a substrate to which a transistor is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. When such a substrate is used, a transistor with excellent properties or a transistor with low power consumption can be formed, a device with high durability, high heat resistance can be provided, or reduction in weight or thickness can be achieved.

Note that the insulating layer 209a having a function as a base film is formed using silicon oxide, silicon oxynitride, silicon nitride, silicon nitride oxide, gallium oxide, hafnium oxide, yttrium oxide, aluminum oxide, aluminum oxynitride, or the like. Note that when silicon nitride, gallium oxide, hafnium oxide, yttrium oxide, aluminum oxide, or the like is used as a material of the insulating layer 209a, it is possible to suppress diffusion of impurities such as alkali metal, water, and hydrogen into the oxide semiconductor layer 237 from the substrate 200a.

The conductive layer 233 having a function as a gate electrode is formed using a metal element selected from aluminum, chromium, copper, tantalum, titanium, molybdenum, nickel, iron, cobalt, and tungsten; an alloy containing any of these metal elements as a component; an alloy containing any of these metal elements in combination; or the like. Further, one or more metal elements selected from manganese and zirconium may be used. The conductive layer 233 may have a single-layer structure or a layered structure of two or more layers. For example, any of the following can be used: a single-layer structure of an aluminum film containing silicon; a single-layer structure of a copper film containing manganese; two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film which contains aluminum and one or more elements selected from titanium, tantalum, tungsten, molybdenum, chromium, neodymium, and scandium may be used.

The conductive layer 233 may be formed using a conductive film that transmits visible light, like the electrodes 208r and 208g. It is also possible to have a layered structure formed using the above conductive material that transmits light and the above metal element.

Further, it is possible to prevent outward diffusion of oxygen from the oxide semiconductor layer 237 and entry of hydrogen, water, or the like into the oxide semiconductor layer 237 from the outside by providing a film having a blocking effect against oxygen, hydrogen, water, and the like as the insulating layer 235. Examples of the film having a blocking effect against oxygen, hydrogen, water, and the like are films of aluminum oxide, aluminum oxynitride, gallium oxide, gallium oxynitride, yttrium oxide, yttrium oxynitride, hafnium oxide, hafnium oxynitride, and the like.

The insulating layer 235 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage of the transistor can be reduced.

The thickness of the insulating layer 235 is preferably greater than or equal to 5 nm and less than or equal to 400 nm, more preferably greater than or equal to 10 nm and less than or equal to 300 nm, still more preferably greater than or equal to 50 nm and less than or equal to 250 nm.

The oxide semiconductor layer 237 is formed using a metal oxide containing at least In or Zn; as a typical example, an In—Ga oxide, an In—Zn oxide, or an In-M-Zn oxide (M is Al, Ga, Y, Zr, La, Ce, or Nd) can be given.

When the oxide semiconductor layer 237 is an In-M-Zn oxide, the atomic ratio of In to M when the summation of In and M is assumed to be 100 atomic % is preferably as follows: the proportion of In is higher than 25 atomic % and the proportion of M is lower than 75 atomic %; more preferably, the proportion of In is higher than 34 atomic % and the proportion of M is lower than 66 atomic %.

The energy gap of the oxide semiconductor layer 237 is 2 eV or more, preferably 2.5 eV or more, and more preferably 3 eV or more. With the use of an oxide semiconductor having such a wide energy gap, the off-state current of the transistor 202r can be reduced.

The thickness of the oxide semiconductor layer 237 ranges from 3 nm to 200 nm, preferably from 3 nm to 100 nm, more preferably from 3 nm to 50 nm.

In the case where the oxide semiconductor layer 237 is formed using an In-M-Zn oxide (M is Al, Ga, Y, Zr, La, Ce, or Nd), it is preferable that the atomic ratio of metal elements of a sputtering target used for forming the In-M-Zn oxide satisfy In M and Zn M. As the atomic ratio of metal elements of such a sputtering target, In:M:Zn=1:1:1, In:M:Zn=1:1:1.2, In:M:Zn=3:1:2, and In:M:Zn=4:1:4.1 are preferable. Note that the atomic ratio of metal elements in the formed oxide semiconductor layer 237 varies from the above atomic ratio of metal elements of the sputtering target within a range of ±40% as an error.

Further, a sputtering target may be appropriately selected in accordance with the composition of the oxide semiconductor film to be formed. Note that when a polycrystalline target is used, a CAAC-OS film and a microcrystalline oxide semiconductor film that are described later can be formed.

Hydrogen contained in the oxide semiconductor reacts with oxygen bonded to a metal atom to be water, and also causes oxygen vacancies in a lattice from which oxygen is released (or a portion from which oxygen is released). Due to entry of hydrogen into the oxygen vacancies, an electron serving as a carrier is generated. Further, in some cases, bonding of part of hydrogen to oxygen bonded to a metal element causes generation of an electron serving as a carrier. Thus, a transistor including an oxide semiconductor which contains hydrogen is likely to be normally on.

Accordingly, it is preferable that hydrogen be reduced as much as possible as well as the oxygen vacancies in the oxide semiconductor layer 237. Specifically, in the oxide semiconductor layer 237, the concentration of hydrogen which is measured by secondary ion mass spectrometry (SIMS) is set to lower than or equal to $5\times10^{19}$ atoms/$cm^3$, more preferably lower than or equal to $1\times10^{19}$ atoms/$cm^3$, more preferably lower than or equal to $5\times10^{18}$ atoms/$cm^3$, more preferably lower than or equal to $1\times10^{18}$ atoms/$cm^3$, more preferably lower than or equal to $5\times10^{17}$ atoms/$cm^3$, still more preferably lower than or equal to $1\times10^{16}$ atoms/$cm^3$. As a result, the transistor 202r has positive threshold voltage (normally-off characteristics).

When silicon or carbon that is one of elements belonging to Group 14 is contained in the oxide semiconductor layer 237, oxygen vacancies are increased in the oxide semiconductor layer 237, and the oxide semiconductor layer 237 becomes an n-type. Thus, the concentration of silicon or carbon (the concentration is measured by SIMS) of the oxide semiconductor layer 237 is lower than or equal to $2\times10^{18}$ atoms/$cm^3$, preferably lower than or equal to $2\times10^{17}$ atoms/$cm^3$. As a result, the transistor 202r has positive threshold voltage (normally-off characteristics).

Further, the concentration of alkali metal or alkaline earth metal of the oxide semiconductor layer 237, which is measured by SIMS, is lower than or equal to $1\times10^{18}$ atoms/$cm^3$, preferably lower than or equal to $2\times10^{16}$ atoms/$cm^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor layer 237. As a result, the transistor 202r has positive threshold voltage (normally-off characteristics).

Further, when nitrogen is contained in the oxide semiconductor layer 237, electrons serving as carriers are generated to increase the carrier density, so that the oxide semiconductor layer 237 easily becomes n-type. Thus, the transistor tends to have normally-on characteristics. For this reason, nitrogen in the oxide semiconductor layer 237 is preferably reduced as much as possible; the concentration of nitrogen which is measured by SIMS is preferably set to, for example, lower than or equal to $5\times10^{18}$ atoms/$cm^3$.

When impurities in the oxide semiconductor layer 237 are reduced, the carrier density of the oxide semiconductor layer 237 can be lowered. The oxide semiconductor layer 237 preferably has a carrier density of $1\times10^{17}$/$cm^3$ or less, more preferably $1\times10^{15}$/$cm^3$ or less, still more preferably $1\times10^{13}$/$cm^3$ or less, yet more preferably $1\times10^{11}$/$cm^3$ or less.

Figure 14A:
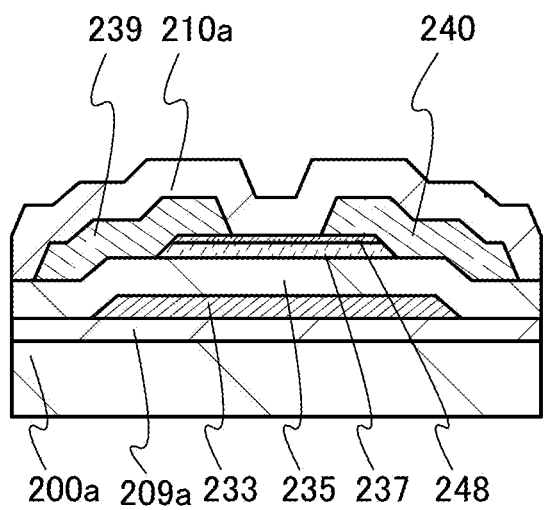
FIGS. 14A and 14B are cross-sectional schematic views for illustrating one embodiment of the present invention.
Figure 14B:
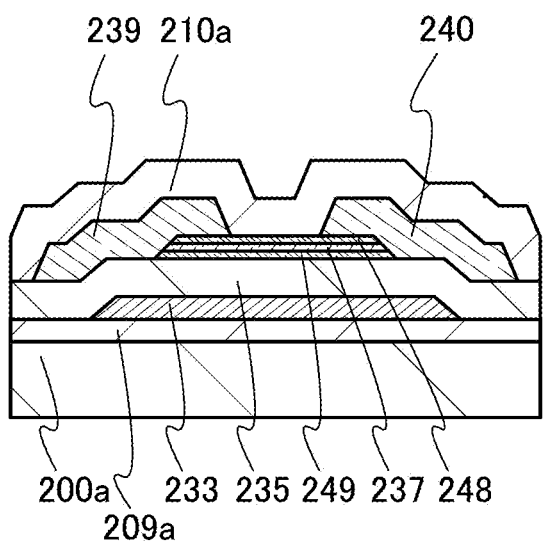

Note that in the oxide semiconductor layer 237, a plurality of oxide semiconductor layers that differs in the atomic ratio of metal elements may be stacked. For example, as shown in FIG. 14A, an oxide semiconductor layer 237 and an oxide semiconductor layer 248 may be sequentially stacked over the insulating layer 235. Alternatively, as shown in FIG. 14B, an oxide semiconductor layer 249, the oxide semiconductor layer 237, and the oxide semiconductor layer 248 may be sequentially stacked over the insulating layer 235. The oxide semiconductor layers 248 and 249 differ from the oxide semiconductor layer 237 in the atomic ratio of metal elements.

An oxide semiconductor having a low impurity concentration and a low density of defect states can be used for the oxide semiconductor layer 237, in which case the transistor can have more excellent electrical characteristics. Here, the state in which impurity concentration is low and density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, the transistor whose channel region is formed in the oxide semiconductor layer 237 including the oxide semiconductor is likely to have positive threshold voltage (normally-off characteristics). A highly purified intrinsic or substantially highly purified intrinsic oxide semiconductor has a low density of defect states and accordingly has a low density of trap states in some cases. The transistor including the oxide semiconductor layer 237 having the highly purified intrinsic or substantially highly purified intrinsic oxide semiconductor has an extremely low off-state current; the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor layer 237 has a small variation in electrical characteristics and high reliability in some cases.

Note that instead of the oxide semiconductor layer 237, a semiconductor layer including silicon or silicon germanium may be formed. The semiconductor layer including silicon or silicon germanium can have an amorphous structure, a polycrystalline structure, or a single crystal structure, as appropriate.

The pair of conductive layers 239 and 240 has a function as a source electrode and a drain electrode. The pair of conductive layers 239 and 240 is formed using a material of the conductive layer 233 having a function as a gate electrode, as appropriate.

Note that in this embodiment, the pair of conductive layers 239 and 240 is provided between the oxide semiconductor layer 237 and the insulating layer 210a, but may be provided between the insulating layer 235 and the oxide semiconductor layer 237.

The insulating layer 210a has a function of protecting the channel region of the transistor. The insulating layer 210a is formed using an oxide insulating film such as silicon oxide, silicon oxynitride, aluminum oxide, aluminum oxynitride, gallium oxide, gallium oxynitride, yttrium oxide, yttrium oxynitride, hafnium oxide, or hafnium oxynitride, or a nitride insulating film such as silicon nitride or aluminum nitride. The insulating layer 210a can have a single-layer structure or a stacked-layer structure.

Note that, by providing an insulating film having a blocking effect against oxygen, hydrogen, water, and the like as the insulating layer 210a, it is possible to prevent outward diffusion of oxygen from the oxide semiconductor layer 237 and entry of hydrogen, water, or the like into the oxide semiconductor layer 237 from the outside. Examples of the insulating film having a blocking effect against oxygen, hydrogen, water, and the like are films of aluminum oxide, aluminum oxynitride, gallium oxide, gallium oxynitride, yttrium oxide, yttrium oxynitride, hafnium oxide, hafnium oxynitride, and the like.

The insulating layer 210a is preferably formed using an oxide insulating film containing more oxygen than that in the stoichiometric composition. Part of oxygen is released by heating from the oxide insulating film containing more oxygen than that in the stoichiometric composition. The oxide insulating film containing more oxygen than that in the stoichiometric composition is an oxide insulating film of which the amount of released oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis in which heat treatment is performed such that a temperature of a film surface is higher than or equal to 100° C. and lower than or equal to 700° C. or higher than or equal to 100° C. and lower than or equal to 500° C. By the heat treatment, oxygen contained in the insulating layer 210a can be transferred to the oxide semiconductor layer 237, so that the amount of oxygen vacancies in the oxide semiconductor layer 237 can be reduced.

Next, a structure of the capacitor 206r is described. The capacitor 206r includes a conductive layer 234 that is provided over the insulating layer 209a and has a function as a capacitor wiring, the insulating layer 235, and a conductive layer 240 that overlaps with the conductive layer 234 with the insulating layer 235 provided therebetween.

The conductive layer 234 is formed at the same time as the conductive layer 233 in the transistor 202r. The insulating layer 235 has a function as a gate insulating film of the transistor 202r and a function as a dielectric layer of the capacitor 206r. The conductive layer 240 has a function as a source electrode or a drain electrode of the transistor 202r and a function as a capacitor electrode of the capacitor 206r.

That is, the capacitor 206r is formed in the process of forming the transistor 202r. Note that the capacitor 206r is not limited to the structure shown in FIGS. 11A to 11C. For example, an oxide semiconductor layer may be provided between the insulating layer 235 and the conductive layer 240. Alternatively, the capacitor may be formed using the insulating layers 210a and 212a and the electrode 208r that are shown in FIG. 10 and one of or both the conductive layer 234 and the conductive layer 240.

The conductive layer included in the capacitor 206r may be formed using a conductive film that transmits visible light. Such a structure can increase the aperture ratio of a pixel. By the increase in aperture ratio, display with the same luminance is possible even when light from a backlight is weakened, leading to low power consumption.

<Modification Example of Transistor 202r>

Figure 12A:
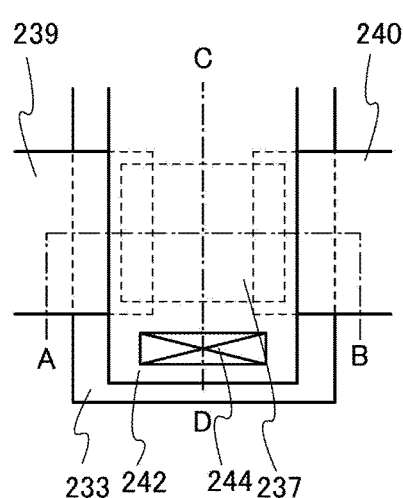
FIGS. 12A to 12C are a top schematic view and cross-sectional schematic views for illustrating one embodiment of the present invention.
Figure 12C:
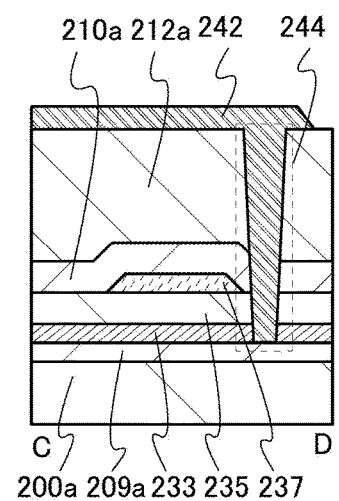
Figure 12B:
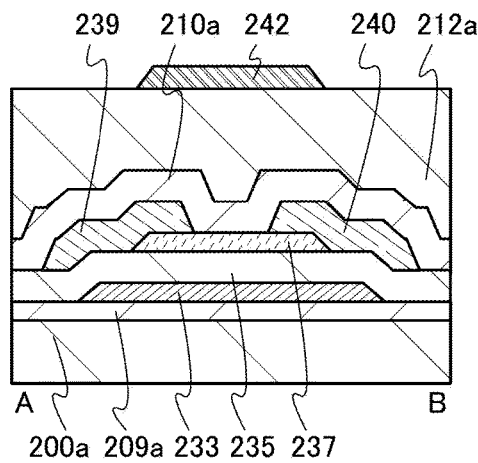

A modification example of the transistor 202r is described using FIGS. 12A to 12C. The transistor shown in FIGS. 12A to 12C has a dual-gate structure.

FIGS. 12A to 12C are a top schematic view and cross-sectional schematic views of the transistor 202r included in a semiconductor device. FIG. 12A is a top schematic view of the transistor, FIG. 12B is a cross-sectional view taken along dashed-dotted line A-B of FIG. 12A, and FIG. 12C is a cross-sectional view taken along dashed-dotted line C-D of FIG. 12A. Note that in FIG. 12A, the substrate 200a, the insulating layer 209a, the insulating layer 235, the insulating layer 210a, the insulating layer 212a, and other components are not shown for the sake of clarity.

The transistor shown in FIGS. 12A to 12C includes a conductive layer 233 that is over the insulating layer 209a and has a function as a gate electrode, the insulating layer 235 that is over the conductive layer 233 and has a function as a gate insulating film, the oxide semiconductor layer 237 that overlaps with the conductive layer 233 with the insulating layer 235 provided therebetween, the pair of conductive layers 239 and 240 in contact with the oxide semiconductor layer 237, the insulating layer 210a over the oxide semiconductor layer 237 and the pair of conductive layers 239 and 240, the insulating layer 212a over the insulating layer 210a, and a conductive layer 242 that is over the insulating layer 212a and has a function as a gate electrode. The conductive layer 242 is connected to the conductive layer 233 in an opening portion 244 in the insulating layers 235, 210a, and 212a.

Note that when a side surface of the oxide semiconductor layer 237 faces the conductive layer 242 in the channel width direction as shown in FIG. 12C, carriers flow not only at the interface between the insulating layer 235 and the oxide semiconductor layer 237 and at the interface between the insulating layer 210a and the oxide semiconductor layer 237 but also in the oxide semiconductor layer 237. Therefore, the amount of transfer of carriers in the transistor is increased. As a result, the on-state current and field-effect mobility of the transistor are increased. The electric field of the conductive layer 242 affects the side surface or an end portion including the side surface and its vicinity of the oxide semiconductor layer 237; thus, generation of a parasitic channel at the side surface or the end portion of the oxide semiconductor layer 237 can be suppressed.

The transistor shown in FIGS. 12A to 12C has higher field-effect mobility and larger on-state current than the transistor shown in FIGS. 11A to 11C. Therefore, by using the transistor with the structure shown in FIGS. 12A to 12C as the transistor provided in the driver circuit portion 250d, a driver circuit portion capable of high-speed operation can be obtained. Furthermore, the occupation area of the driver circuit portion 250d can be reduced, and the area of the pixel portion 250p can be increased. By providing the transistor having large on-state current in the pixel portion 250p, signal delay in wirings can be reduced and display unevenness can be suppressed even though the number of wirings in a large-sized display device or a high-resolution display device is increased. Note that all of transistors included in the driver circuit portion 250d may have the same structure or may have two or more kinds of structures. All of a plurality of transistors included in the pixel portion 250p may have the same structure, or may have two or more kinds of structures.

<Structures of Transistor 202t and Electrode 238>

Figure 13:
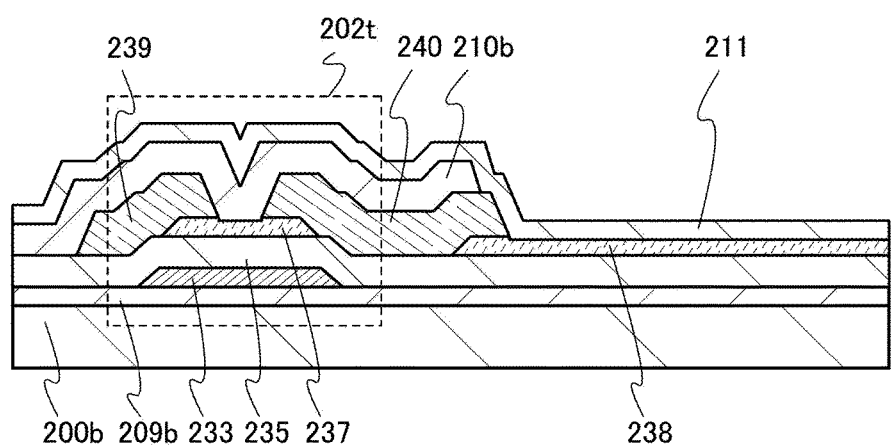
FIG. 13 is a cross-sectional schematic view for illustrating one embodiment of the present invention.

FIG. 13 is a cross-sectional schematic view of the transistor 202t and the electrode 238 that are included in the touch sensor. The transistor 202t is formed over the insulating layer 209b. The insulating layer 209b is formed using a material of the insulating layer 209a as appropriate. The insulating layer 209b is formed over the substrate 200b.

The transistor 202t shown in FIG. 13 can have a structure similar to that of the transistor 202r.

The electrode 238 is formed over the insulating layer 235. The electrode 238 is connected to the conductive layer 240 of the transistor 202t.

The insulating layer 210b is formed over the transistor 202t. Note that the insulating layer 210b has the opening portion in which the electrode 238 is exposed. The insulating layer 211 is formed over the insulating layer 210b and the electrode 238.

The electrode 238 is formed by processing an oxide semiconductor film formed at the same time as the oxide semiconductor layer 237. Therefore, the electrode 238 and the oxide semiconductor layer 237 include similar elements. Furthermore, the electrode 238 has a crystal structure similar to or different from that of the oxide semiconductor layer 237. By adding impurities to or forming oxygen vacancies in the oxide semiconductor layer formed at the same time as the oxide semiconductor layer 237, the film becomes the electrode 238. Typical examples of the impurities included in the electrode 238 are one or more of a rare gas, hydrogen, boron, nitrogen, fluorine, aluminum, and phosphorus. Typical examples of the rare gas are helium, neon, argon, krypton, and xenon.

The oxide semiconductor layer 237 and the electrode 238 are both formed over the insulating layer 235, but differ in impurity concentration. Specifically, the electrode 238 has a higher impurity concentration than the oxide semiconductor layer 237. For example, in the oxide semiconductor layer 237, the hydrogen concentration measured by secondary ion mass spectroscopy is less than or equal to $5 \times 10^{19}$ atoms/cm$^3$, preferably less than or equal to $5 \times 10^{18}$ atoms/cm$^3$, preferably less than or equal to $1 \times 10^{18}$ atoms/cm$^3$, preferably less than or equal to $5 \times 10^{17}$ atoms/cm$^3$, preferably less than or equal to $1 \times 10^{16}$ atoms/cm$^3$. In the electrode 238, the hydrogen concentration measured by secondary ion mass spectrometry is greater than or equal to $8 \times 10^{19}$ atoms/cm$^3$, preferably greater than or equal to $1 \times 10^{20}$ atoms/cm$^3$, preferably greater than or equal to $5 \times 10^{20}$ atoms/cm$^3$. The concentration of hydrogen contained in the electrode 238 is greater than or equal to 2 times or greater than or equal to 10 times that of hydrogen contained in the oxide semiconductor layer 237.

By setting the hydrogen concentration of the oxide semiconductor layer 237 in the range described above, generation of electrons serving as carriers in the oxide semiconductor layer 237 can be suppressed. As a result, the transistor 202t has positive threshold voltage (normally-off characteristics).

The electrode 238 has lower resistivity than the oxide semiconductor layer 237. The resistivity of the electrode 238 is preferably greater than or equal to $1 \times 10^{-8}$ times and less than $1 \times 10^{-1}$ times that of the oxide semiconductor layer 237. The resistivity of the electrode 238 is typically greater than or equal to $1 \times 10^{-3}$ Ωcm and less than $1 \times 10^4$ Ωm, or greater than or equal to $1 \times 10^{-3}$ Ωcm and less than $1 \times 10^{-1}$ Ωcm.

When the oxide semiconductor layer formed at the same time as the oxide semiconductor layer 237 is exposed to plasma, the oxide semiconductor layer is damaged, and oxygen vacancies can be generated. For example, when a film is formed over the oxide semiconductor layer by a plasma CVD method or a sputtering method, the oxide semiconductor layer is exposed to plasma and oxygen vacancies are generated. Alternatively, when the oxide semiconductor layer is exposed to plasma in etching treatment for formation of the opening portion in the insulating layer 210a, oxygen vacancies are generated. Alternatively, when the oxide semiconductor layer is exposed to plasma such as a mixed gas of oxygen and hydrogen, hydrogen, a rare gas, and ammonia, oxygen vacancies are generated. Alternatively, when impurities are added to the oxide semiconductor layer, oxygen vacancies can be formed and impurities can be added to the oxide semiconductor layer. As a method for adding the impurities, an ion doping method, an ion implantation method, plasma treatment, and the like can be given. For the plasma treatment method, plasma is generated in a gas atmosphere containing the impurities to be added, and ions of the impurities accelerated by plasma treatment are made to collide with the oxide semiconductor layer, whereby oxygen vacancies can be formed in the oxide semiconductor layer.

When hydrogen as an example of impurities is contained in an oxide semiconductor in which oxygen vacancies are generated by addition of impurity elements, hydrogen enters an oxygen vacant site and forms a donor level in the vicinity of the conduction band. As a result, the conductivity of the oxide semiconductor layer is increased, so that the oxide semiconductor layer becomes a conductor. An oxide semiconductor layer having become a conductor can be referred to as an oxide conductor layer. That is, it can be said that the oxide semiconductor layer 237 is formed of an oxide semiconductor, and the electrode 238 is formed of an oxide conductor layer. It can also be said that the electrode 238 is formed of an oxide semiconductor layer having high conductivity. It can also be said that the electrode 238 is formed of a metal oxide layer having high conductivity.

Oxide semiconductor layers generally have a visible light transmitting property because of their large energy gap. An oxide conductor layer is an oxide semiconductor layer having a donor level in the vicinity of the conduction band. Therefore, the influence of absorption due to the donor level is small, and an oxide conductor layer has a visible light transmitting property comparable to that of an oxide semiconductor layer.

The insulating layers 210b and 211 can be formed using a material similar to that of the insulating layer 210a.

Note that the insulating layer 211 preferably contains hydrogen. Since the electrode 238 is in contact with the insulating layer 211, hydrogen contained in the insulating layer 211 can be diffused into the oxide semiconductor film formed at the same time as the oxide semiconductor layer 237. As a result, impurities can be added to the oxide semiconductor film formed at the same time as the oxide semiconductor layer 237.

Furthermore, the insulating layer 210b is preferably formed using an oxide insulating layer containing more oxygen than that in the stoichiometric composition, and the insulating layer 211 is preferably formed using an insulating layer containing hydrogen. By transfer of oxygen contained in the insulating layer 210b to the oxide semiconductor layer 237 of the transistor 202t, the amount of oxygen vacancies in the oxide semiconductor layer 237 can be reduced and a change in the electrical characteristics of the transistor 202t can be reduced. In addition, by transfer of hydrogen contained in the insulating layer 211, the conductivity of the electrode 238 can be increased.

Note that a conductive layer that transmits visible light may be used for the electrode 238.

In FIG. 13, one electrode of the capacitor is formed at the same time as the oxide semiconductor layer of the transistor. Thus, a step of forming another conductive layer is not needed to form the capacitor, and thereby the number of manufacturing steps can be reduced.

In the display device described in this embodiment, by changing the potential of the conductive layer 234 depending on a change in the potential of the electrode 214, the potential of the electrode that is included in the liquid crystal element and has a function as a pixel electrode can be changed depending on the change in the potential of the electrode 214. As a result, an electric field between a pair of electrodes included in the liquid crystal element can be made constant, which achieves excellent display quality.

The structure described in this embodiment can be used in appropriate combination with the structure described in any of the other embodiments.

(Embodiment 4)
<Structure of Oxide Semiconductor Film>

In this embodiment, a structure of an oxide semiconductor film that can be used for a transistor is described.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, it is difficult to find a clear boundary between crystal parts, that is, a grain boundary. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

According to the high-resolution plan TEM image of a plane of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the amount of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

A microcrystalline oxide semiconductor film has a region where a crystal part can be found in the high-resolution TEM image and a region where a clear crystal part cannot be easily found in the high-resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high-resolution TEM image of the nc-OS film, for example, a grain boundary is not easily and clearly found in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Hence, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found easily.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS) film.

In a high-resolution TEM image of the amorphous-like OS film, a void may be seen. Furthermore, in the high-resolution TEM image, there are a region where a crystal part is clearly observed and a region where a crystal part cannot be observed easily. In the amorphous-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the amorphous-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes in which the spacing therebetween is from 0.28 nm to 0.30 nm corresponds to the a-b plane of the $InGaZnO_4$ crystal, focusing on the lattice fringes in the high-resolution TEM image.

Note that an oxide semiconductor film may be a stacked film including two or more films of an amorphous oxide semiconductor film, an amorphous-like OS film, a microcrystalline oxide semiconductor film, and a CAAC-OS film, for example.

The structure described in this embodiment can be used in appropriate combination with the structure described in any of the other embodiments.

(Embodiment 5)

In this embodiment, a display module using any of the display devices of one embodiment of the present invention is described. Furthermore, structural examples of electronic appliances each using a display module of one embodiment of the present invention is described.

Figure 15:
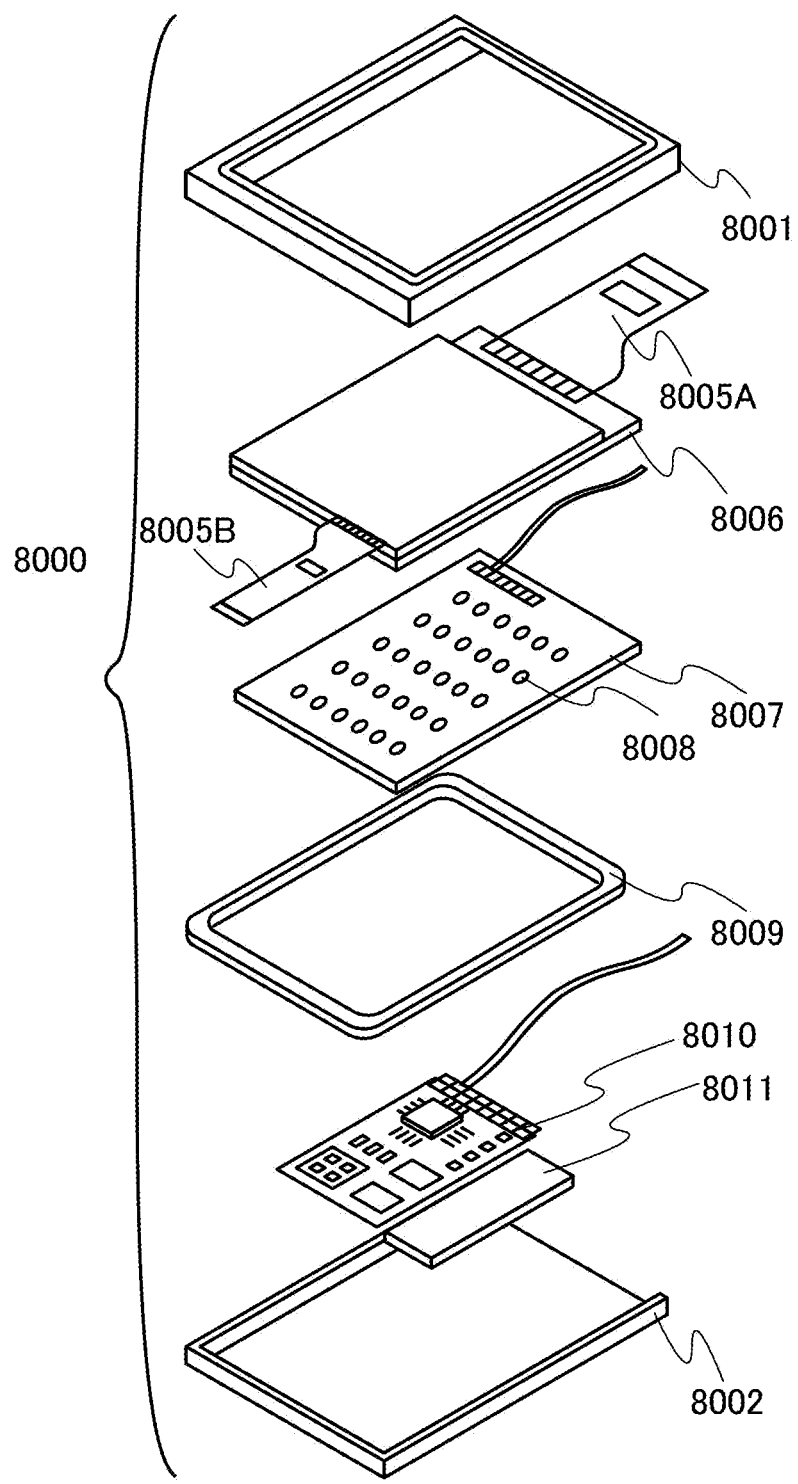
FIG. 15 is a diagram showing a display module of one embodiment of the present invention.

In a display module 8000 illustrated in FIG. 15, a display device 8006 connected to an FPC 8005A and an FPC 8005B, a backlight unit 8007, a frame 8009, a printed board 8010, and a battery 8011 are provided between an upper cover 8001 and a lower cover 8002. Note that the backlight unit 8007, the battery 8011, and the like are not provided in some cases.

The shapes and sizes of the upper cover 8001 and the lower cover 8002 can be changed as appropriate in accordance with the size of the display device 8006.

The backlight unit 8007 includes a light source 8008. The light source 8008 may be provided at an end portion of the backlight unit 8007 and a light diffusing plate may be used. Note that when an electroluminescence (EL) element is used as the light source 8008, a flexible light source 8008 can be obtained.

In addition, a wavelength conversion member may be provided between the backlight unit 8007 and the display device 8006. The wavelength conversion member contains a wavelength conversion substance such as a fluorescent pigment, a fluorescent dye, or a quantum dot. Such a wavelength conversion substance can absorb light from the backlight unit 8007 and convert part of or the whole of the light into light with another wavelength. The quantum dot that is one of wavelength conversion substances is a particle having a diameter of from 1 nm to 100 nm. By using the wavelength conversion member containing a quantum dot, the color reproducibility of the display device can be increased. Furthermore, the wavelength conversion member may function as a light-guiding plate.

The frame 8009 has a function of protecting the display device 8006 and a function as an electromagnetic shield for blocking electromagnetic waves generated by the operation of the printed board 8010. The frame 8009 may also have a function as a radiator plate.

The printed board 8010 is provided with a power supply circuit and a signal processing circuit for outputting a video signal and a clock signal. The printed board 8010 is connected to the display device 8006, the backlight unit 8007, and the battery 8011. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet. By thinning components of the display module 8000, the display module 8000 can be flexible. The backlight unit 8007 can be thinned using a light-guiding plate.

Figure 16A:
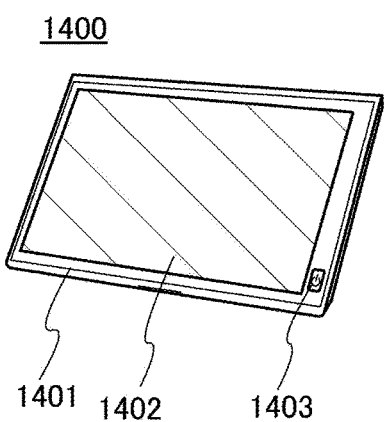
FIGS. 16A to 16C each illustrate an electronic device of one embodiment of the present invention.
Figure 16B:
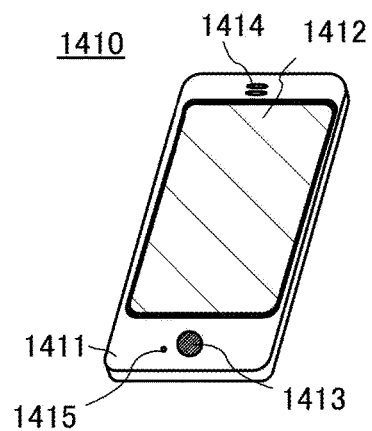
Figure 16C:
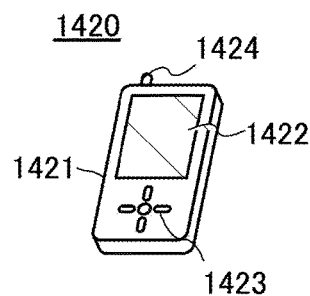

FIGS. 16A to 16C are each an external view of an electronic device including the display module of one embodiment of the present invention.

Examples of the electronic device include a television device (also referred to as a television or a television receiver), a monitor of a computer or the like, a camera such as a digital camera or a digital video camera, a digital photo frame, a mobile phone (also referred to as a mobile telephone, a mobile phone device, or a smartphone), a portable game console, a portable information terminal, an audio reproducing device, and a large-sized game machine such as a pachinko machine.

FIG. 16A illustrates a portable information terminal 1400 including a display portion. The portable information terminal 1400 includes a display portion 1402 and an operation button 1403 which are incorporated in a housing 1401. The display module of one embodiment of the present invention can be used in the display portion 1402. Consequently, a portable information terminal which achieves both thickness reduction and favorable display quality is obtained.

FIG. 16B illustrates a mobile phone 1410. The mobile phone 1410 includes a display portion 1412, an operation button 1413, a speaker 1414, and a microphone 1415 which are incorporated in a housing 1411. The display module of one embodiment of the present invention can be used in the display portion 1412. Consequently, a mobile phone which achieves both thickness reduction and favorable display quality is obtained.

FIG. 16C illustrates an audio reproducing device 1420. The audio reproducing device 1420 includes a display portion 1422, an operation button 1423, and an antenna 1424 which are incorporated in a housing 1421. In addition, the antenna 1424 transmits and receives data via a wireless signal. The display module of one embodiment of the present invention can be used in the display portion 1422. Consequently, an audio reproducing device which achieves both thickness reduction and favorable display quality is obtained.

As described above, the electronic devices described in this embodiment each include the display device according to any of the above embodiments. Therefore, electronic devices which achieve both thickness reduction and favorable display quality are obtained.

[Example 1]

In this example, the conductivity of oxide semiconductor films is described with reference to FIGS. 19A to 19C, FIG. 20, and FIG. 21.

First, structures of samples are described with reference to FIGS. 19A to 19C.

Figure 19A:
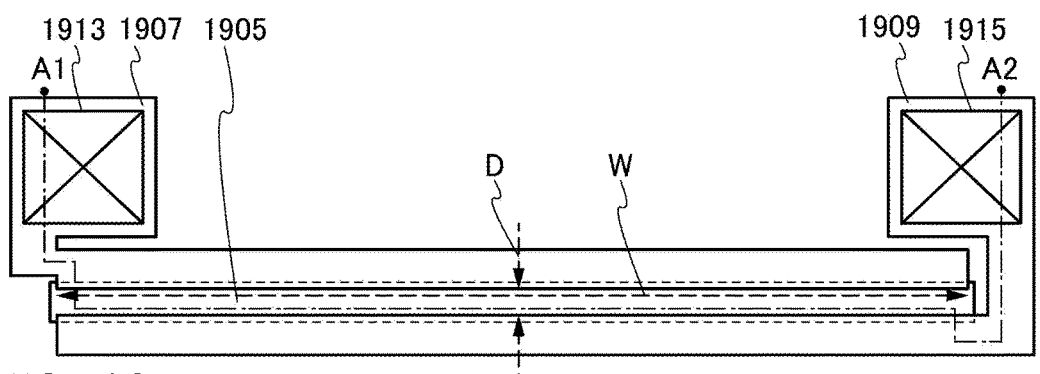
FIGS. 19A to 19C illustrate sample structures.
Figure 19B:
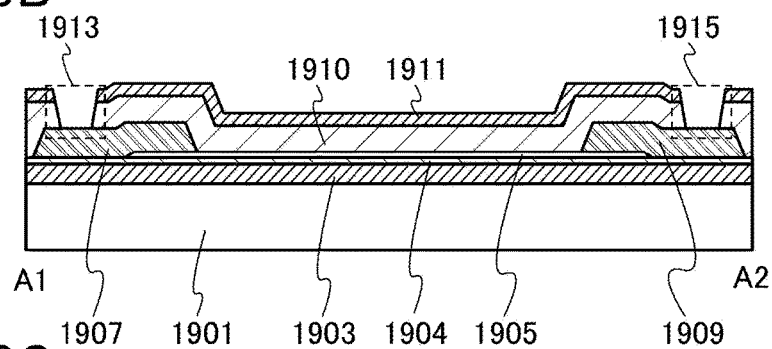
Figure 19C:
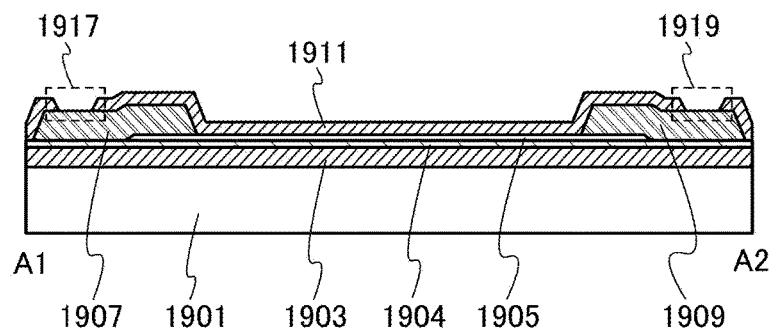

FIG. 19A is a top view of Sample 1 and Sample 2. FIGS. 19B and 19C are cross-sectional views taken along the dashed-dotted line A1-A2 in FIG. 19A. Note that top views of Sample 1 and Sample 2 are the same, and the cross-sectional views thereof are different because the stacked-layer structures of the cross sections are different. FIG. 19B is a cross-sectional view of Sample 1. FIG. 19C is a cross-sectional view of Sample 2. Note that an oxide semiconductor film 1905 of Sample 1 corresponds to a channel region of a transistor (FET), and an oxide semiconductor film 1905 of Sample 2 corresponds to an electrode of a capacitor (Cs).

As for Sample 1, an insulating film 1903 is formed over a glass substrate 1901, an insulating film 1904 is formed over the insulating film 1903, and the oxide semiconductor film 1905 is formed over the insulating film 1904. The both ends of the oxide semiconductor film 1905 are covered with a conductive film 1907 and a conductive film 1909 each serving as an electrode, and the oxide semiconductor film 1905 and the conductive films 1907 and 1909 are covered with an insulating film 1910 and an insulating film 1911. Note that opening portions 1913 and 1915 are provided in the insulating films 1910 and 1911, and the conductive film 1907 and the conductive film 1909 are exposed in the opening portion 1913 and the opening portion 1915, respectively.

As for Sample 2, the insulating film 1903 is formed over the glass substrate 1901, the insulating film 1904 is formed over the insulating film 1903, and the oxide semiconductor film 1905 is formed over the insulating film 1904. The both ends of the oxide semiconductor film 1905 are covered with the conductive films 1907 and 1909 each serving as an electrode, and the oxide semiconductor film 1905 and the conductive films 1907 and 1909 are covered with the insulating film 1911. Note that an opening portion 1917 and an opening portion 1919 are provided in the insulating film 1911, and the conductive film 1907 and the conductive film 1909 are exposed in the opening portion 1917 and the opening portion 1919, respectively.

As described above, the structures of the insulating films in contact with the top surface of the oxide semiconductor film 1905 are different in Sample 1 and Sample 2. In Sample 1, the oxide semiconductor film 1905 and the insulating film 1910 are in contact with each other. In Sample 2, the oxide semiconductor film 1905 and the insulating film 1911 are in contact with each other.

Methods for forming the samples are described.

First, a method for forming Sample 1 is described.

A 400-nm-thick silicon nitride film was formed as the insulating film 1903 over the glass substrate 1901 by a plasma CVD method.

Next, a 50-nm-thick silicon oxynitride film was formed as the insulating film 1904 over the insulating film 1903 by a plasma CVD method.

Next, a 35-nm-thick In—Ga—Zn oxide film (hereinafter also referred to as an IGZO film) was formed as the oxide semiconductor film 1905 over the insulating film 1904 by a sputtering method using a metal oxide target (In:Ga:Zn=1:1:1). Then, heat treatment was performed at 450° C. in a nitrogen atmosphere for one hour, and after that, another heat treatment was performed at 450° C. in a mixed gas of nitrogen and oxygen for one hour. Then, the oxide semiconductor film 1905 was formed by etching treatment using a mask formed through a photolithography process.

Next, the conductive films 1907 and 1909 were formed over the insulating film 1903 and the oxide semiconductor film 1905 in such a manner that a 50-nm-thick tungsten film, a 400-nm-thick aluminum film, and a 100-nm-thick titanium film were stacked in this order by a sputtering method, and were then subjected to etching treatment with a mask formed through a photolithography process.

Next, a 450-nm-thick silicon oxynitride film was formed as the insulating film 1910 over the insulating film 1904, the oxide semiconductor film 1905, the conductive film 1907, and the conductive film 1909 by a plasma CVD method, and then heat treatment was performed at 350° C. under a mixed atmosphere of nitrogen and oxygen for one hour.

Next, a 50-nm-thick silicon nitride film was formed as the insulating film 1911 over the insulating film 1910 by a plasma CVD method.

Next, a mask was formed over the insulating film 1911 through a photolithography process and then etching treatment was performed on the insulating film 1911, so that the opening portions 1913 and 1915 were formed in the insulating films 1910 and 1911.

Through the above process, Sample 1 was formed.

Next, a method for forming Sample 2 is described.

A 450-nm-thick silicon oxynitride film was formed as the insulating film 1910 over the insulating film 1903, the oxide semiconductor film 1905, the conductive film 1907, and the conductive film 1909 of Sample 1 by a plasma CVD method, and then heat treatment was performed at 350° C. under a mixed atmosphere of nitrogen and oxygen for one hour. After that, the insulating film 1910 was removed.

Next, a 50-nm-thick silicon nitride film was formed as the insulating film 1911 over the insulating film 1904, the oxide semiconductor film 1905, the conductive film 1907, and the conductive film 1909 by a plasma CVD method.

Next, a mask was formed over the insulating film 1911 through a photolithography process and then etching treatment was performed on the insulating film 1911, so that the opening portions 1917 and 1919 were formed in the insulating film 1911.

Through the above process, Sample 2 was formed.

Next, the conductivity of the oxide semiconductor films 1905 provided in each of Sample 1 and Sample 2 was measured. In Sample 1, probes were made contact with the conductive film 1907 in the opening portion 1913 and the conductive film 1909 in the opening portion 1915 to measure a sheet resistance value of the oxide semiconductor film 1905. In Sample 2, probes were made contact with the conductive film 1907 in the opening portion 1917 and the conductive film 1909 in the opening portion 1919 to measure a sheet resistance value of the oxide semiconductor film 1905. Note that in the oxide semiconductor film 1905 in each of Sample 1 and Sample 2, a width W in which the conductive films 1907 and 1909 face each other was 1 mm and a distance D therebetween was 10 μm. Further, in each of Sample 1 and Sample 2, the potential of the conductive film 1907 was a ground potential, and 1 V was applied to the conductive film 1909. Then, the conductivity was calculated from the sheet resistance value of the oxide semiconductor film 1905 included in each of Sample 1 and Sample 2.

Figure 20:
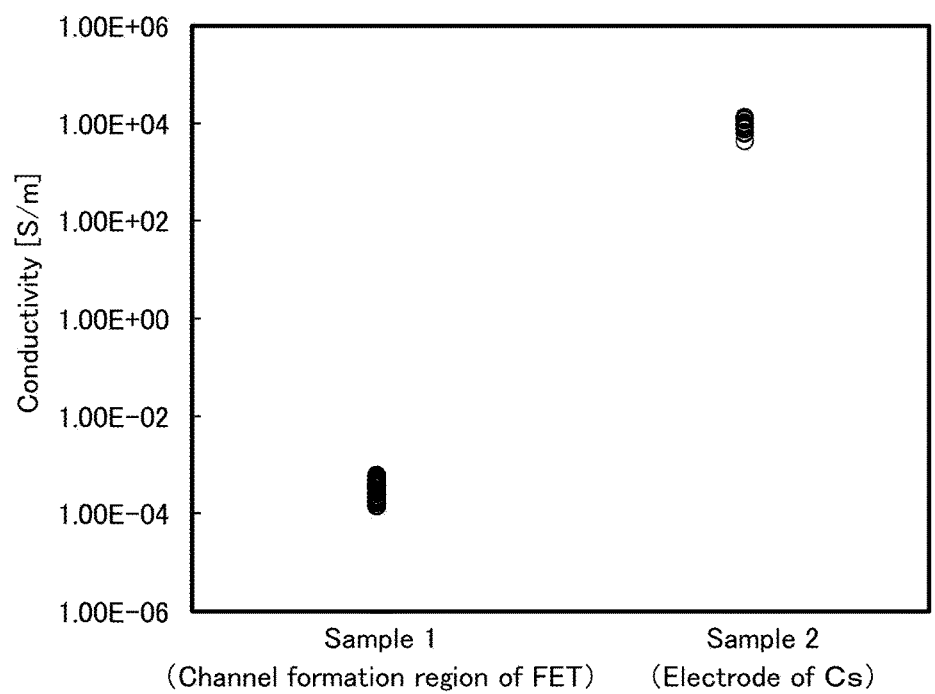
FIG. 20 illustrates conductivity.

FIG. 20 shows the conductivity of Sample 1 and Sample 2.

The average conductivity of Sample 1 was $3.04 \times 10^{-4}$ S/m. The average conductivity of Sample 2 was $9.91 \times 10^{3}$ S/m.

In this manner, the conductivity of the oxide semiconductor film 1905 is varied depending on the difference in the insulating film in contact with the oxide semiconductor film 1905.

In Sample 1, the silicon oxynitride film used as the insulating film 1910 was formed in contact with the top surface of the oxide semiconductor film 1905. The oxide semiconductor film 1905 is not in contact with the silicon nitride film used as the insulating film 1911. On the other hand, the silicon nitride film used as the insulating film 1911 was formed in contact with the top surface of the oxide semiconductor film 1905 in Sample 2. When the oxide semiconductor film 1905 is thus provided in contact with the silicon nitride film used as the insulating film 1911, defects, typically oxygen vacancies are generated in the oxide semiconductor film 1905, and hydrogen contained in the silicon nitride film is transferred to or diffused into the oxide semiconductor film 1905. As a result, conductivity of the oxide semiconductor film 1905 is increased.

For example, in the case where an oxide semiconductor film is used for a channel region of a transistor, it is preferable to employ a structure in which a silicon oxynitride film is provided in contact with the oxide semiconductor film as shown in Sample 1. Further, as an electrode of a capacitor, it is preferable to employ a structure in which a silicon nitride film is provided in contact with an oxide semiconductor film as shown in Sample 2. With such a structure, even when an oxide semiconductor film used for a channel region of a transistor and an oxide semiconductor film used for an electrode of a capacitor are formed through the same process, the conductivity of the oxide semiconductor films can be made different from each other.

Next, Sample 3 whose top surface shape is different from that of Sample 2 and whose cross-sectional shape is the same as that of Sample 2 was formed. Then, conductivity of Sample 3 preserved under a high-temperature high-humidity environment was measured.

Next, a sheet resistance value of the oxide semiconductor film 1905 provided in Sample 3 was measured. In Sample 3, probes were made contact with the conductive film 1907 in the opening portion 1917 and the conductive film 1909 in the opening portion 1919 to measure a sheet resistance of the oxide semiconductor film 1905. Note that in the oxide semiconductor film 1905 in Sample 3, in the top view, a width Win which the conductive films 1907 and 1909 face each other was 1.5 mm and a distance D therebetween was 10 µm. Further, in Sample 3, the potential of the conductive film 1907 was a ground potential, and 1 V was applied to the conductive film 1909. The sheet resistance values of Sample 3 were measured after Sample 3 was preserved at 60° C. under an atmosphere with a humidity of 95% for 60 hours, 130 hours, 650 hours, and 1000 hours. Here, two Samples 3 were measured. Then, conductivity thereof was calculated from the sheet resistance values.

Figure 21:
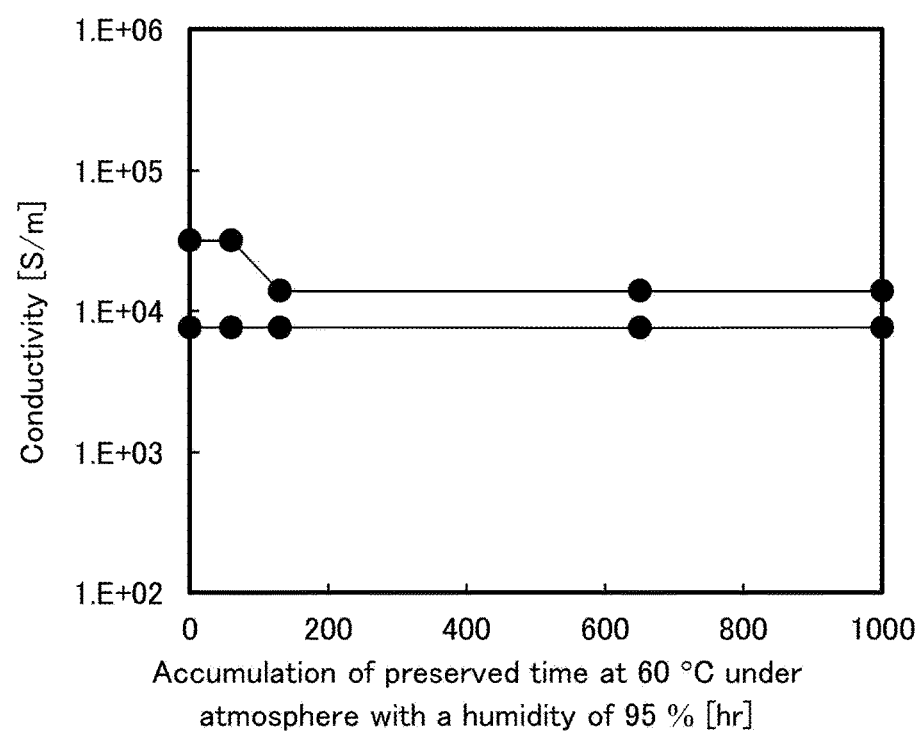
FIG. 21 illustrates conductivity.

FIG. 21 shows conductivity of Sample 3.

It is shown from FIG. 21 that Sample 3 has high conductivity. It is also shown that the amount of change in the conductivity of Sample 3 over time were small. As described above, the amount of change in the conductivity of the oxide semiconductor film in contact with the silicon nitride film is small under a high-temperature high-humidity environment; therefore, the oxide semiconductor film can be used as an electrode of a capacitor.

Note that the structure described in this example can be used as appropriate in combination with any of the structures in the other embodiments and example.

This application is based on Japanese Patent Application serial no. 2014-088200 filed with Japan Patent Office on Apr. 22, 2014, Japanese Patent Application serial no. 2014-088223 filed with Japan Patent Office on Apr. 22, 2014, and Japanese Patent Application serial no. 2014-106476 filed with Japan Patent Office on May 22, 2014, the entire contents of which are hereby incorporated by reference.

What is claimed is:

1. A display device comprising:
   a first substrate;
   a first transistor over the first substrate;
   a first capacitor over the first substrate, the first capacitor being electrically connected to a first wiring;
   a first electrode electrically connected to the first transistor;
   a liquid crystal layer over the first transistor and the first capacitor;
   a capacitive type touch sensor over the liquid crystal layer, the capacitive type touch sensor comprising:
      a second transistor over the liquid crystal layer; and
      a second capacitor over the liquid crystal layer, the second capacitor comprising a second electrode and a third electrode; and
   a second substrate over the second transistor and the second capacitor,
   wherein the first electrode and the third electrode overlap each other with the liquid crystal layer provided between the first electrode and the third electrode,
   wherein the first electrode is configured to serve as a pixel electrode of the liquid crystal layer,
   wherein one electrode of the first capacitor is electrically connected to the first electrode,
   wherein the first wiring is configured to be supplied with a first signal,
   wherein one of a source and a drain of the second transistor is electrically connected to the second electrode,
   wherein the third electrode is configured to serve as a counter electrode of the liquid crystal layer,
   wherein the third electrode is configured to be supplied with a second signal,
   wherein the second signal is synchronized with the first signal,
   wherein the first transistor includes an oxide semiconductor layer which includes a first metal element,
   wherein the other electrode of the first capacitor includes the first metal element and oxygen,
   wherein the oxide semiconductor layer includes a region having a first hydrogen concentration, and
   wherein the other electrode of the first capacitor includes a region having a second hydrogen concentration which is different from the first hydrogen concentration.

2. The display device according to claim 1, further comprising a third transistor and a fourth transistor,
   wherein a gate of the third transistor is electrically connected to the second electrode,
   wherein the other of the source and the drain of the second transistor is electrically connected to a second wiring,
   wherein the second wiring is configured to be supplied with a constant potential,
   wherein one of a source and a drain of the third transistor is electrically connected to one of a source and a drain of the fourth transistor,
   wherein the other of the source and the drain of the fourth transistor is electrically connected to a third wiring, and
   wherein the third wiring is configured to change a potential thereof depending on a potential of the second electrode.

3. The display device according to claim 2,
   wherein the second transistor and the third transistor include an oxide semiconductor layer.

4. The display device according to claim 3,
   wherein the second electrode is provided in the same layer as the oxide semiconductor layer in the second transistor.

5. A display module comprising:
   the display device according to claim 1; and
   a printed board electrically connected to the display device.

6. An electronic device comprising:
   the display module according to claim 5; and
   an operation button.

7. A display device comprising:
   a first transistor and a first capacitor electrically connected to each other;
   a liquid crystal element over the first transistor and the first capacitor, the liquid crystal element comprising a first electrode, a second electrode, and a liquid crystal layer; and
   a capacitive type touch sensor over the liquid crystal layer, the capacitive type touch sensor comprising:
      a second transistor and a second capacitor electrically connected to each other; and
      a third electrode electrically connected to the second transistor, the third electrode being included in the second capacitor, wherein the first electrode is electrically connected to the first transistor and the first capacitor, wherein the second electrode is one of electrodes of the second capacitor, wherein the first electrode and the second electrode overlap each other with the liquid crystal layer provided between the first electrode and the second electrode, wherein the display device is configured so that signals input to the second electrode and one of electrodes of the first capacitor are synchronized with each other, wherein the first transistor includes an oxide semiconductor layer which includes a first metal element, wherein the one of the electrodes of the first capacitor includes the first metal element and oxygen, wherein the oxide semiconductor layer includes a region having a first hydrogen concentration, and wherein the one of the electrodes of the first capacitor includes a region having a second hydrogen concentration which is different from the first hydrogen concentration.

8. The display device according to claim 7, further comprising:

a third transistor and a fourth transistor, wherein a gate of the third transistor is electrically connected to the third electrode, wherein one of a source and a drain of the second transistor is electrically connected to a first wiring, wherein the first wiring is configured to be supplied with a constant potential, wherein one of a source and a drain of the third transistor is electrically connected to one of a source and a drain of the fourth transistor, wherein the other of the source and the drain of the fourth transistor is electrically connected to a second wiring, and wherein the second wiring is configured to change a potential thereof depending on a potential of the third electrode.

9. The display device according to claim 8, wherein the second transistor and the third transistor include an oxide semiconductor layer.

10. The display device according to claim 9, wherein the third electrode is provided in the same layer as the oxide semiconductor layer in the second transistor.

11. A display module comprising:

the display device according to claim 7; and a printed board electrically connected to the display device.

12. An electronic device comprising:

the display module according to claim 11; and an operation button.

* * * * *